(12) United States Patent
Cheng et al.

(10) Patent No.: US 12,166,075 B2
(45) Date of Patent: Dec. 10, 2024

(54) METHOD AND STRUCTURE FOR GATE-ALL-AROUND DEVICES

(71) Applicant: Taiwan Semiconductor Manufacturing Company, Ltd., Hsinchu (TW)

(72) Inventors: Chun-Fai Cheng, Hsinchu (TW); Chang-Miao Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 384 days.

(21) Appl. No.: 17/723,685

(22) Filed: Apr. 19, 2022

(65) Prior Publication Data

US 2023/0335586 A1   Oct. 19, 2023

(51) Int. Cl.
*H01L 21/8234* (2006.01)
*H01L 29/06* (2006.01)
(Continued)

(52) U.S. Cl.
CPC ............ *H01L 29/0665* (2013.01); *H01L 21/823412* (2013.01); *H01L 21/823418* (2013.01);
(Continued)

(58) Field of Classification Search
CPC ......... H01L 29/0665; H01L 21/823412; H01L 21/823418; H01L 21/823468;
(Continued)

(56) References Cited

U.S. PATENT DOCUMENTS 9,443,854 B2   9/2016   Greene et al.
10,483,378 B2   11/2019   Ching et al.
(Continued)

OTHER PUBLICATIONS

Huan-Chieh Su et al., "Method and Structure for Reducing Source/Drain Contact Resistance at Wafer Backside", U.S. Appl. No. 17/236,675, filed Apr. 21, 2021, Assignee: Taiwan Semiconductor Manufacturing Co., Ltd., 35 pages specification, 17 pages drawings.
(Continued)

*Primary Examiner* — David Vu
*Assistant Examiner* — Brandon C Fox
(74) *Attorney, Agent, or Firm* — HAYNES AND BOONE, LLP

(57) ABSTRACT

A method includes providing a substrate, an isolation structure, and a fin extending from the substrate and through the isolation structure. The fin includes a stack of layers having first and second layers that are alternately stacked and have first and second semiconductor materials respectively. A topmost layer of the stack is one of the second layers. The structure further has a sacrificial gate stack engaging a channel region of the fin. The method further includes forming gate spacers and forming sidewall spacers on sidewalls of the fin in a source/drain region of the fin, wherein the sidewall spacers extend above a bottom surface of a topmost one of the first layers. The method further includes etching the fin in the source/drain region, resulting in a source/drain trench; partially recessing the second layers exposed in the source/drain trench, resulting in gaps; and forming dielectric inner spacers inside the gaps.

20 Claims, 18 Drawing Sheets

(51) Int. Cl.
*H01L 29/66* (2006.01)
*H01L 29/786* (2006.01)

(52) U.S. Cl.
CPC ............... *H01L 21/823468* (2013.01); *H01L 21/823481* (2013.01); *H01L 29/6656* (2013.01); *H01L 29/66742* (2013.01); *H01L 29/78618* (2013.01); *H01L 29/78696* (2013.01)

(58) Field of Classification Search
CPC ......... H01L 21/823481; H01L 29/6656; H01L 29/66742; H01L 29/78618; H01L 29/78696; H01L 29/42392
See application file for complete search history.

(56) References Cited

U.S. PATENT DOCUMENTS

| | | | |
|---|---|---|---|
| 2014/0264604 A1 | 9/2014 | Tsai et al. | |
| 2016/0284702 A1* | 9/2016 | Park | H01L 29/66795 |
| 2017/0005188 A1* | 1/2017 | Cheng | H01L 29/42392 |
| 2020/0098764 A1 | 3/2020 | Wang et al. | |
| 2021/0134952 A1 | 5/2021 | Fung | |
| 2021/0273103 A1 | 9/2021 | Chen et al. | |
| 2021/0336004 A1 | 10/2021 | Huang et al. | |
| 2021/0336033 A1 | 10/2021 | Huang et al. | |
| 2021/0375691 A1 | 12/2021 | Chen et al. | |
| 2021/0391325 A1 | 12/2021 | Su et al. | |
| 2021/0391421 A1 | 12/2021 | Chu et al. | |
| 2022/0013453 A1 | 1/2022 | Chen et al. | |
| 2022/0285531 A1* | 9/2022 | Hsu | H01L 29/0653 |

OTHER PUBLICATIONS

Po-Yu Lin et al., "Source and Drain Engineering Process for Multigate Devices", U.S. Appl. No. 17/464,265, filed Sep. 1, 2021, Assignee: Taiwan Semiconductor Manufacturing Company, Ltd., 39 pages specification, 15 pages drawings.

Thompson et al: "A 90-nm Logic Technology Featuring Strained-Silicon", IEEE Transations on Electron Devices, vol. 51, No. 11, Nov. 2004. pp. 1790-1797.

* cited by examiner

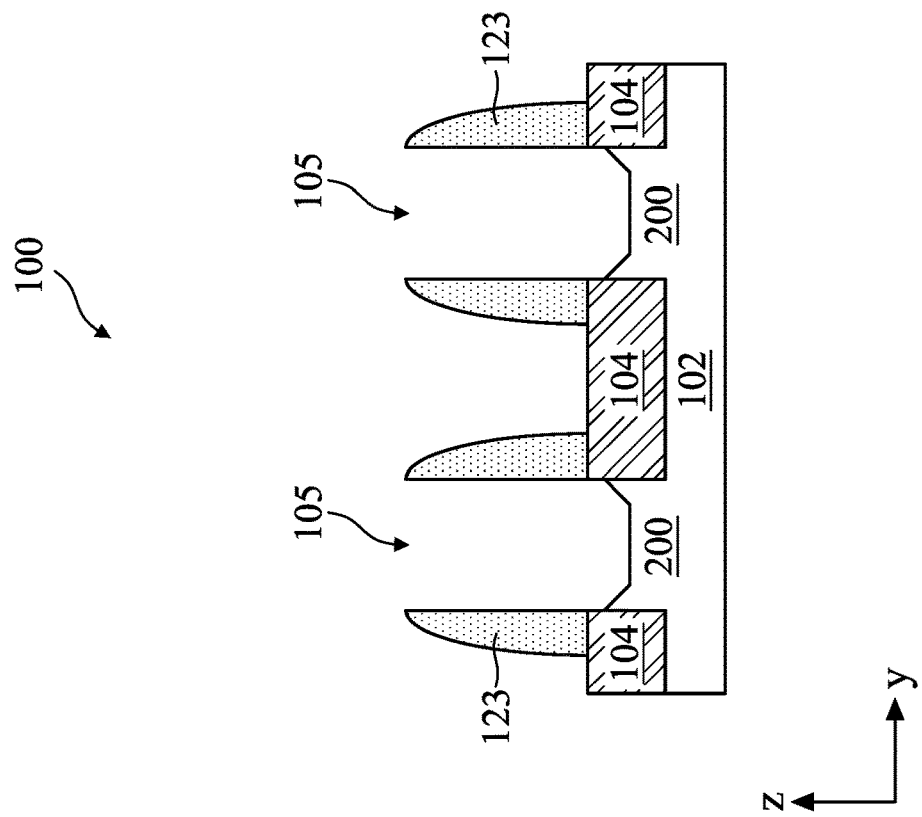
FIG. 9B
FIG. 9A

METHOD AND STRUCTURE FOR GATE-ALL-AROUND DEVICES

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all-around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. As GAA devices continue to scale, challenges have arisen when reducing the parasitic capacitance of gate electrodes and source/drain (S/D) structures. Accordingly, although existing GAA devices and methods for fabricating the same have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4, 6A, 6B, 7A, 7B, 8A, 8B, 9A, 9B, 9C, 10A, 10B, 10C-1, 10C-2, 11A, 11B, 11C, 12, 13, 14, 15, 16, and 17 are diagrammatic cross-sectional views of a multi-gate device, in portion, at various fabrication stages associated with the method in FIG. 1A and FIG. 1B, according to various aspects of the present disclosure.

DETAILED DESCRIPTION

Figure 1A:
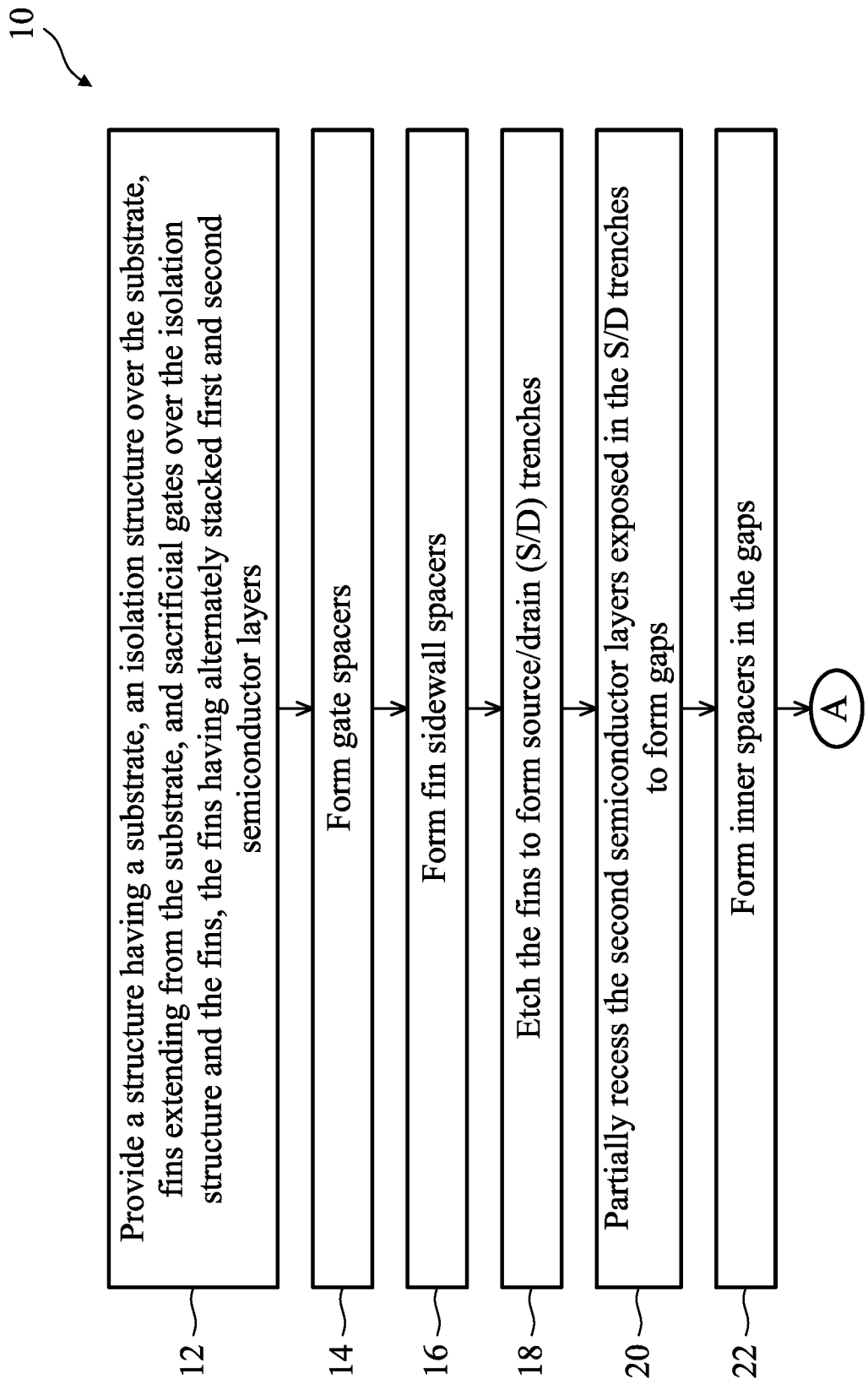
FIG. 1A and FIG. 1B are a flow chart of a method for fabricating a multi-gate device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This present disclosure relates generally to semiconductor devices and their manufacturing methods, and more particularly to using sidewall spacers (or fin sidewall spacers) to confine the lateral growth of source/drain structures in gate-all-around (GAA) devices, such as nanosheet devices or nanowire devices. The height of the sidewall spacers is promoted and tuned by an extra semiconductor layer in a stack of semiconductor layers forming fin structures. The opposing surfaces of the sidewall spacers sandwich the source/drain structures and limit the lateral growth of the source/drain structures. This helps to prevent defects caused by lateral merging of source/drain structures, reduce the parasitic capacitance of the source/drain structures, and speed up the switching speed of the transistors. By using the sidewall spacers to confine the source/drain structures, some embodiments of the present disclosure do not use dielectric fins as the separator between source/drain structures, which leaves more room for gate replacement processes (e.g., operation 32), such as multiple gate patterning. In other words, dielectric fins are optional or omitted in some embodiments of the present disclosure. Other benefits of the present disclosure will be apparent to those skilled in the art.

Figure 1B:
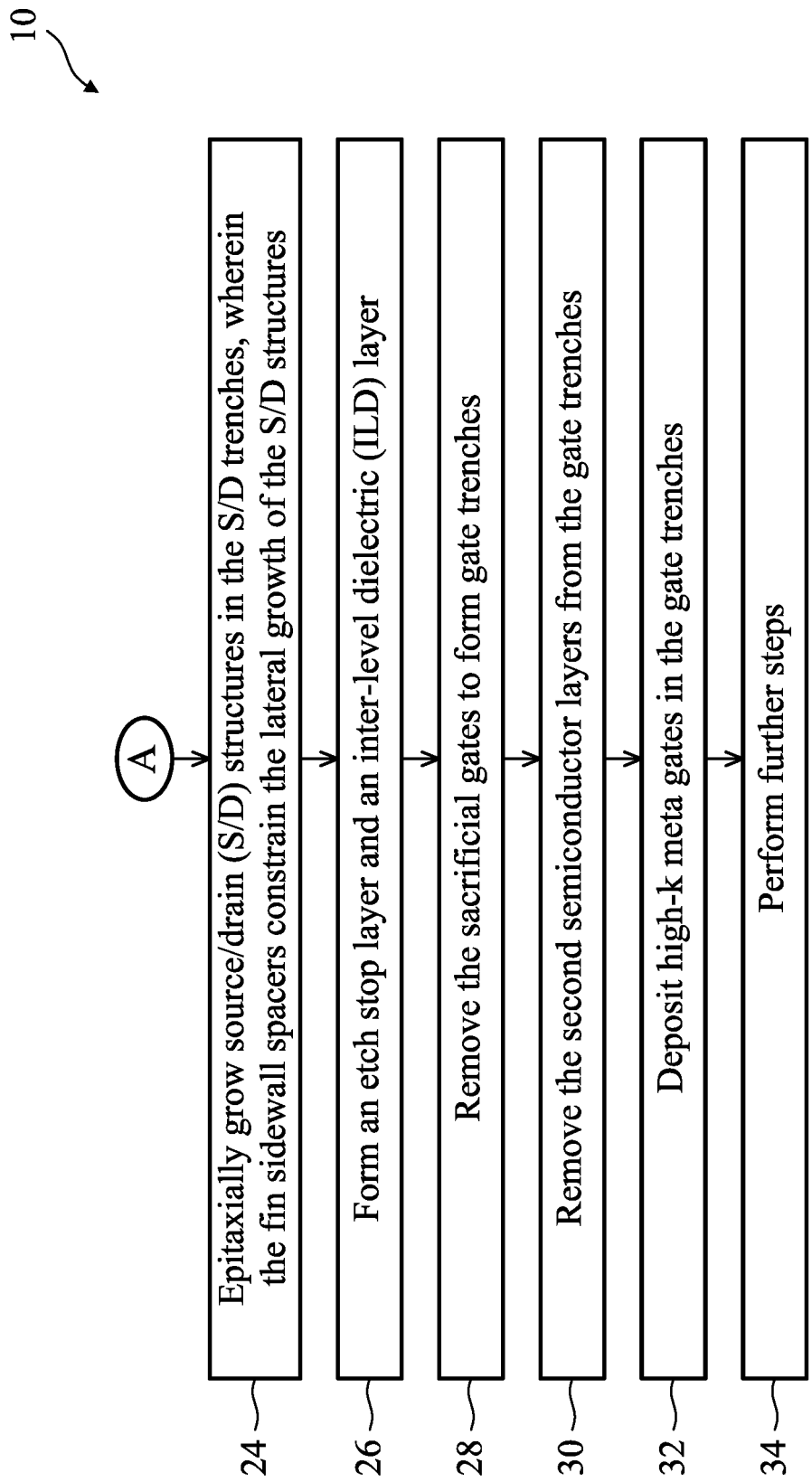
Figure 2:
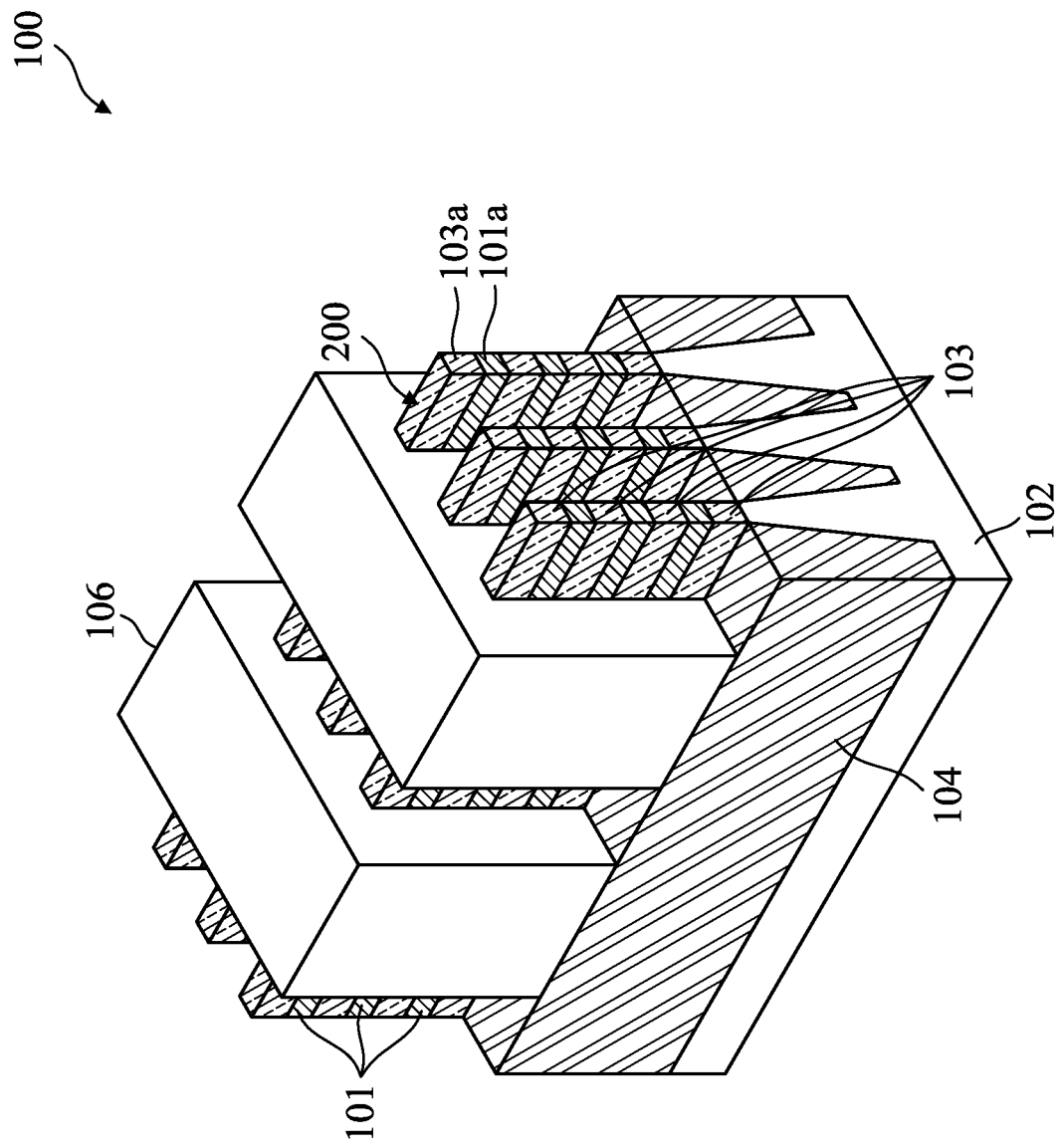
FIGS. 2, 3, and 5 are diagrammatic perspective views of a multi-gate device, in portion, at some fabrication stages of the method in FIG. 1A and FIG. 1B, according to various aspects of the present disclosure.
Figure 3:
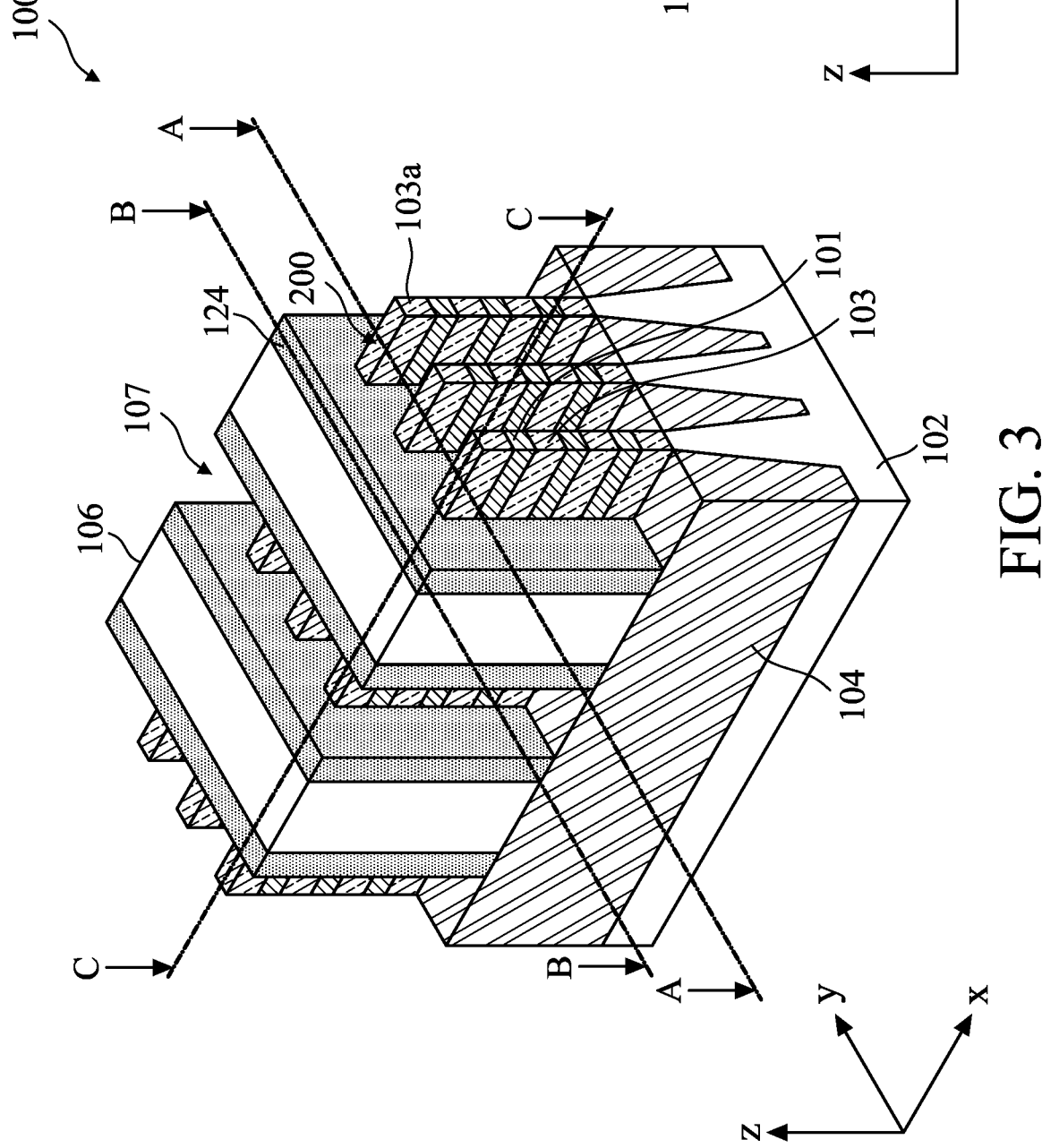

FIG. 1A and FIG. 1B are a flow chart of a method 10 for fabricating a multi-gate device 100 according to various aspects of the present disclosure. In some embodiments, the multi-gate device 100 includes GAA transistors. FIGS. 2, 3, and 5 are diagrammatic perspective views of the multi-gate device 100, in portion, at some fabrication stages of the method 10, according to some aspects of the present disclosure. FIGS. 4, 6A, 6B, 7A, 7B, 8A, 9A, 10A, 11A, 12, and 13 are diagrammatic cross-sectional views of the multi-gate device 100, in portion, along the A-A line in FIG. 3 (i.e., in a source/drain region) at various fabrication stages associated with the method 10, according to aspects of the present disclosure. FIGS. 8B, 9B, 10B, and 11B are diagrammatic cross-sectional views of the multi-gate device 100, in portion, along the B-B line in FIG. 3 (i.e., in a gate spacer region) at various fabrication stages associated with the method 10, according to aspects of the present disclosure. FIGS. 9C, 10C-1, 10C-2, 11C, 14, 15, 16, and 17 are diagrammatic cross-sectional views of the multi-gate device 100, in portion, along the C-C line in FIG. 3 at various fabrication stages associated with the method 10, according to aspects of the present disclosure.

The method 10 includes operations 12, 14, 16, 18, 20, 22, 24, 26, 28, 30, 32, and 34. Additional processing is contemplated by the present disclosure. Additional operations can be provided before, during, and after the method 10, and some of the operations described can be moved, replaced, or eliminated for additional embodiments of the method 10.

The multi-gate device 100 may be included in a microprocessor, a memory, and/or other IC device. In some embodiments, the multi-gate device 100 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), FinFET, nanosheet FETs, nanowire FETs, other types of multi-gate FETs, complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the multi-gate device 100 is included in memory devices, such as static random access memory (SRAM), non-volatile random access memory (NVRAM), flash memory, an electrically erasable programmable read only memory (EEPROM), an electrically programmable read-only memory (EPROM), other suitable memory type, or combinations thereof. FIGS. 2-17 have been simplified for the sake of clarity to better understand the inventive concepts of the present disclosure. Additional features can be added in the multi-gate device 100, and some of the features described below can be replaced, modified, or eliminated in other embodiments of the multi-gate device 100. The fabrication of the device 100 is described below in conjunction with embodiments of the method 10.

At operation 12, the method 10 (FIG. 1A) provides an initial structure of the device 100. Turning to FIG. 2, the device 100 includes a substrate 102, fins 200 extending from the substrate 102, isolation structure 104 over the substrate 102 and between lower portions of the fins 200, and sacrificial gate stacks 106 over the fins 200 and the isolation structure 104. Each of the fins 200 includes a stack of semiconductor layers 101 and 103. For convenience of discussion, the topmost layer of semiconductor layers 101 is also labeled as 101a, and the topmost layer of semiconductor layers 103 is also labeled as 103a. The various components of the device 100 are further described below.

In the present embodiment, the substrate 102 includes silicon. For example, it is a silicon wafer. Alternatively or additionally, substrate 102 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 102 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 102 can include various doped regions depending on design requirements of the device 100. For example, the substrate 102 may include p-type doped regions configured for n-type GAA transistors and n-type doped regions configured for p-type GAA transistors. P-type doped regions are doped with p-type dopants, such as boron, indium, other p-type dopant, or combinations thereof. N-type doped regions are doped with n-type dopants, such as phosphorus, arsenic, other n-type dopant, or combinations thereof. In some implementations, the substrate 102 includes doped regions formed with a combination of p-type dopants and n-type dopants. The various doped regions can be formed directly on and/or in the substrate 102, for example, providing a p-well structure, an n-well structure, a dual-well structure, a raised structure, or combinations thereof. An ion implantation process, a diffusion process, and/or other suitable doping process can be performed to form the various doped regions.

Each of the fins 200 includes semiconductor layers 101 and semiconductor layers 103 stacked vertically (e.g., along the z-direction) in an interleaving or alternating configuration from a surface of the substrate 102. In some embodiments, the semiconductor layers 101 and the semiconductor layers 103 are epitaxially grown in the depicted interleaving and alternating configuration, layer-by-layer, until a desired number of semiconductor layers is reached. In the depicted embodiment, each fin 200 includes three semiconductor layers 101 and four semiconductor layers 103. However, the present disclosure contemplates embodiments where each fin 200 includes more or less semiconductor layers, for example, depending on a number of channels desired for the device 100. For example, each fin 200 may include two to ten semiconductor layers 101. Further, in the present disclosure, the number of semiconductor layers 103 is one more than the number of semiconductor layers 101. In other words, the bottommost layer and the topmost layer of the stack are both semiconductor layers 103. Particularly, the semiconductor layer 103a serves to protect the semiconductor layer 101a during various etching processes and helps to promote and tune the height of a sidewall spacer 123 (see FIG. 5) that will be discussed later.

A composition of the semiconductor layers 101 is different than a composition of the semiconductor layers 103 to achieve etching selectivity and/or different oxidation rates during subsequent processing. For example, the semiconductor layers 101 and 103 may include different materials, different constituent atomic percentages, different constituent weight percentages, and/or other different characteristics to achieve desired etching selectivity during an etching process, such as an etching process implemented to form suspended channel layers in channel regions of the device 100. In the present embodiment, the semiconductor layers 101 include silicon and the semiconductor layers 103 include silicon germanium, which has a different etch selectivity than silicon. In some embodiments, the semiconductor layers 101 and 103 can include the same material but with different constituent atomic percentages to achieve the etching selectivity and/or different oxidation rates. For example, the semiconductor layers 101 and 103 can both include silicon germanium, where the semiconductor layers 101 have a first silicon atomic percent and/or a first germanium atomic percent and the semiconductor layers 103 have a second, different silicon atomic percent and/or a second, different germanium atomic percent. The present disclosure contemplates that the semiconductor layers 101 and 103 include any combination of semiconductor materials that can provide desired etching selectivity, desired oxidation rate differences, and/or desired performance characteristics (e.g., materials that maximize current flow), including any of the semiconductor materials disclosed herein. In some embodiments, thickness of each semiconductor layer 101 is about 1 nm to about 10 nm, thickness of each semiconductor layer 103 is about 1 nm to about 10 nm, and the two thicknesses can be the same or different. In some embodiments, the thickness of the semiconductor layer 103a is in a range from about 2 nm to about 20 nm for tuning the height of a sidewall spacer 123 (see FIG. 5) that will be discussed later.

The fins 200 may be patterned from a stack of semiconductor layers (101 and 103) by any suitable method. For example, the fins 200 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Patterning spacers are formed alongside the patterned sacrificial layer using a self-aligned process. The sacrificial layer is then removed, and the remaining patterning spacers, or mandrels, may then be used as a masking element for patterning the fins 200. For example, the masking element may be used for etching recesses into semiconductor layers over or in the substrate 102, leaving the fins 200 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 200 may be suitable.

The isolation structure 104 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 104 is formed by etching trenches in or over the substrate 102 (e.g., as part of the process of forming the fins 200), filling the trenches with an insulating material, and performing a chemical mechanical planarization (CMP) process and/or an etching back process to the insulating material, leaving the remaining insulating material as the isolation structure 104. Other types of isolation structure may also be suitable, such as field oxide and LOCal Oxidation of Silicon (LOCOS). The isolation structure 104 may include a multi-layer structure, for example, having one or more liner layers (e.g., silicon nitride) on surfaces of the substrate 102 and the fins 200 and a main isolating layer (e.g., silicon dioxide) over the one or more liner layers.

At operation 14, the method 10 (FIG. 1A) forms gate spacers 124 on sidewalls of the sacrificial gate stacks 106.

Referring to FIG. 3, The gate spacers 124 may comprise a dielectric material, such as silicon oxide, silicon nitride, silicon oxynitride, silicon carbide, other dielectric material, or combinations thereof, and may comprise one or multiple layers of material. The gate spacers 124 may be formed by depositing a spacer material as a blanket layer over the isolation structure 104, the fins 200, and the sacrificial gate stacks 106. Then the spacer material is etched by an anisotropic etching process to expose the isolation structure 104, the sacrificial gate stacks 106, and the fins 200. Portions of the spacer material on the sidewalls of the sacrificial gate stacks 106 become the gate spacers 124. Adjacent gate spacers 124 provide openings 107 that expose portions of the fins 200 in the source/drain regions of the device 100. The gate spacers 124 may be a single layer or multi-layer structure in various embodiments. The gate spacers 124 may have rounded top corners. In some embodiments, part of the spacer material 124' remains on sidewalls of the fins 200, such as shown in FIG. 4.

Figure 5:
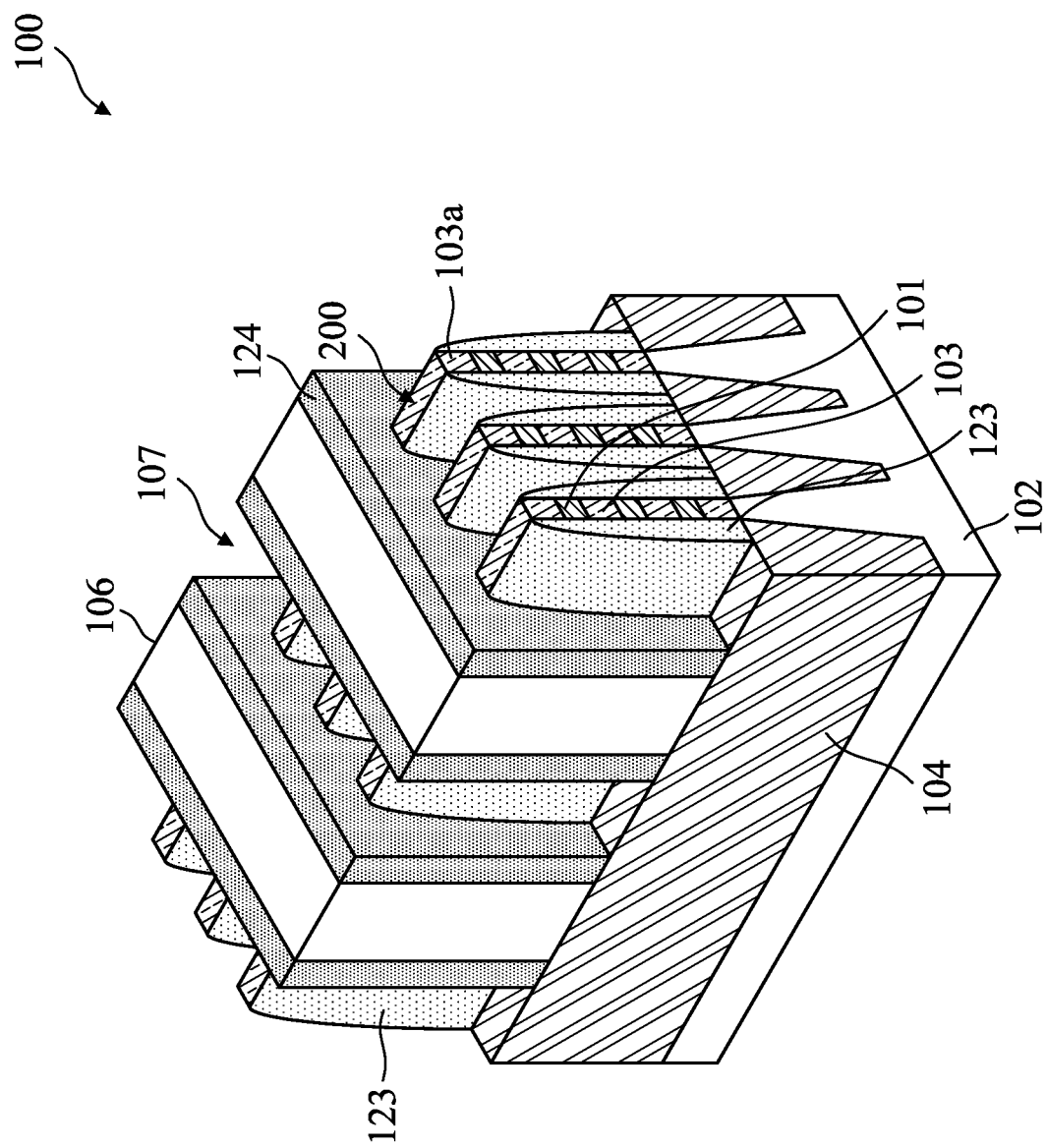
Figure 6B:
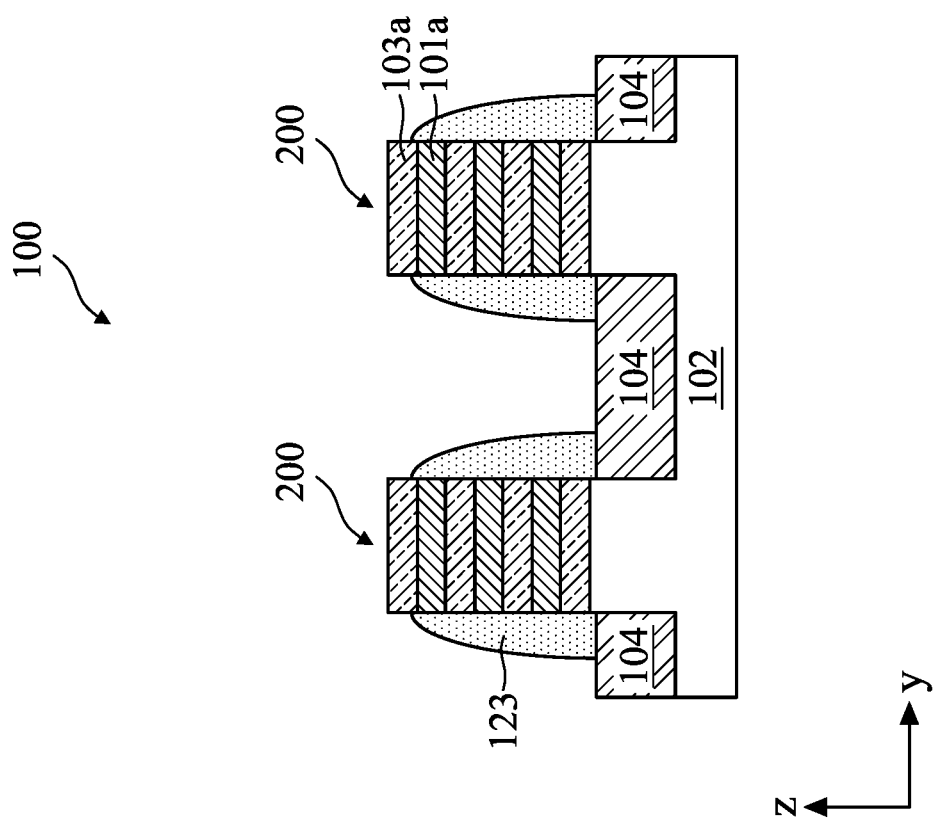
Figure 6A:
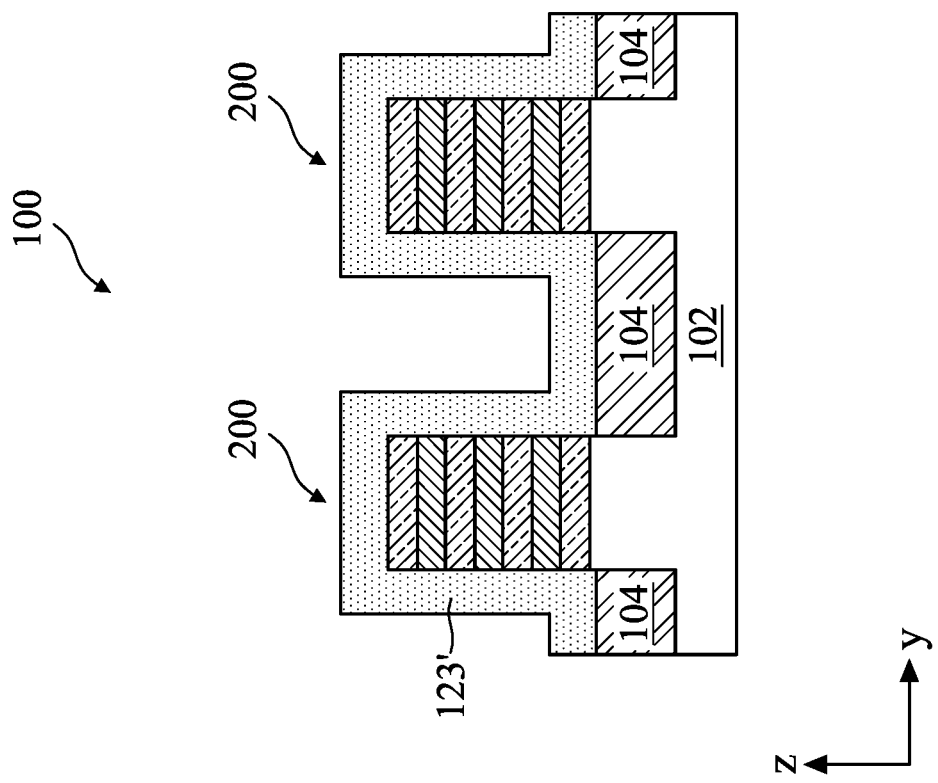

At operation 16, the method 10 (FIG. 1A) forms sidewall spacers (or fin sidewall spacers) 123 on sidewalls of the fins 200 and adjacent the gate spacers 124. Referring to FIG. 5, the sidewall spacers 123 are formed with rounded top corners in this embodiment. A pair of sidewall spacers 123 sandwich each fin 200 in a source/drain region of the respective fin. The top of the fins 200 are exposed (i.e., the semiconductor layer 103a is exposed). In an embodiment, the sidewall spacers 123 are formed by depositing a sidewall spacer material as a blanket layer 123' over the isolation structure 104, the fins 200, the sacrificial gate stacks 106, and the gate spacers 124, such as illustrated in FIG. 6A. The blanket layer 123' has a substantially uniform thickness upon the various surfaces. Then the blanket layer 123' is etched by an anisotropic etching process to expose the isolation structure 104, the sacrificial gate stacks 106, the gate spacers 124, and top surfaces of the fins 200, such as illustrated in FIG. 6B. In an embodiment, the etching process uses the isolation structure 104 as an etch stop. Once the isolation structure 104 is exposed, the etching process performs slightly over-etching to the blanket layer 123' to ensure that the top surfaces of the fins 200 are exposed. Portions of the blanket layer 123' on the sidewalls of the fins 200 become the sidewall spacers 123. During the above etching process, the semiconductor layer 103a protects the semiconductor layer 101a. Further, having the semiconductor layer 103a promotes the height of the sidewall spacers 123. In the embodiment depicted in FIG. 6B, the sidewall spacers 123 extend above the top surface of the semiconductor layer 101a. In other words, the top surface of the sidewall spacers 123 are above the top surface of the semiconductor layer 101a.

Figure 4:
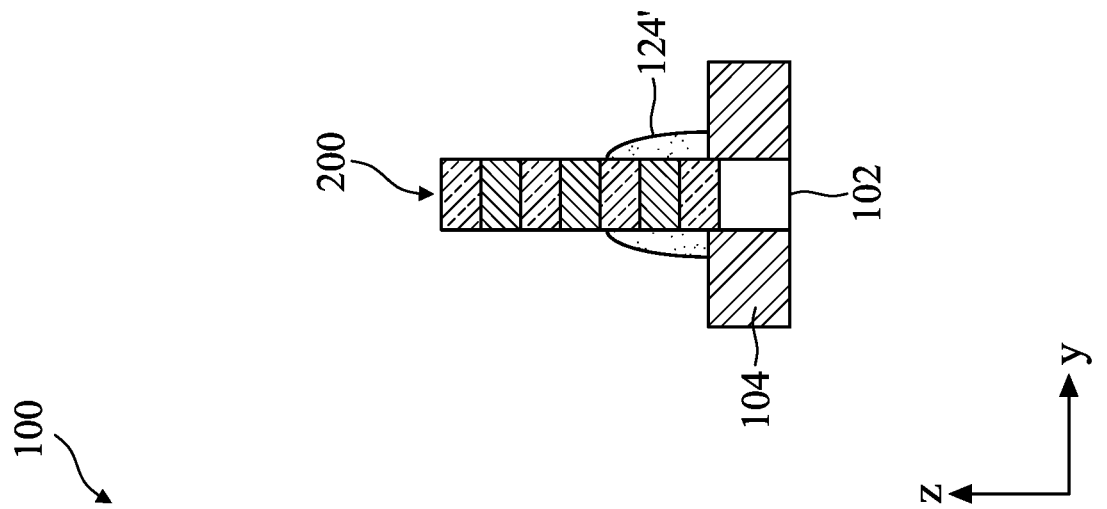
Figure 7B:
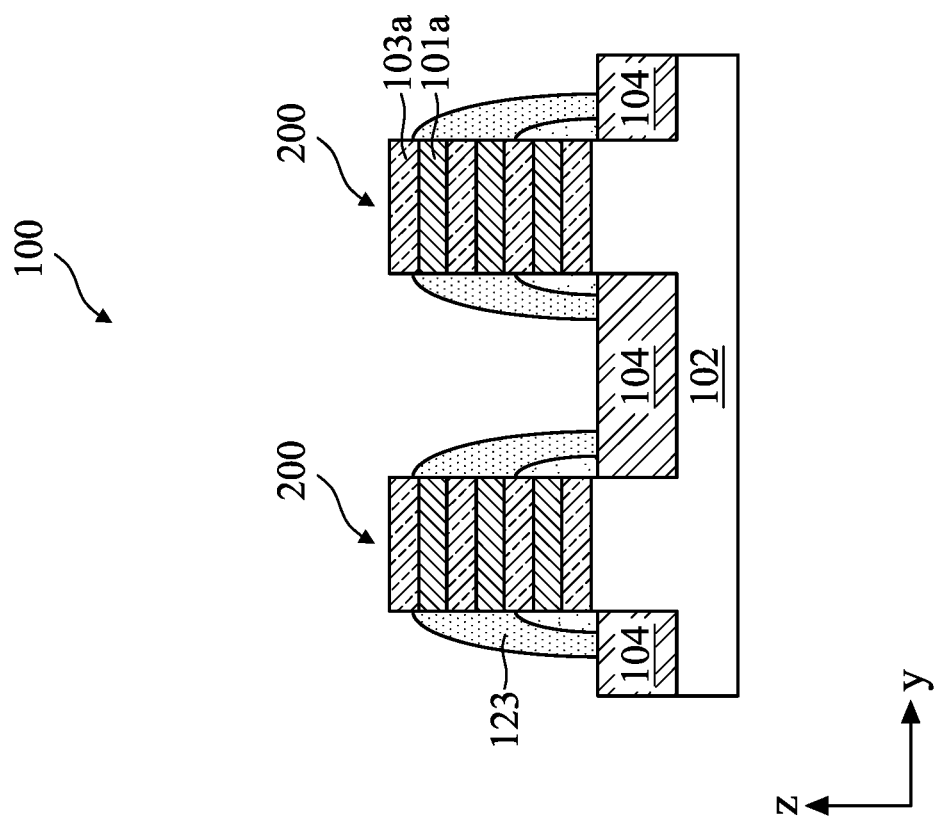
Figure 7A:
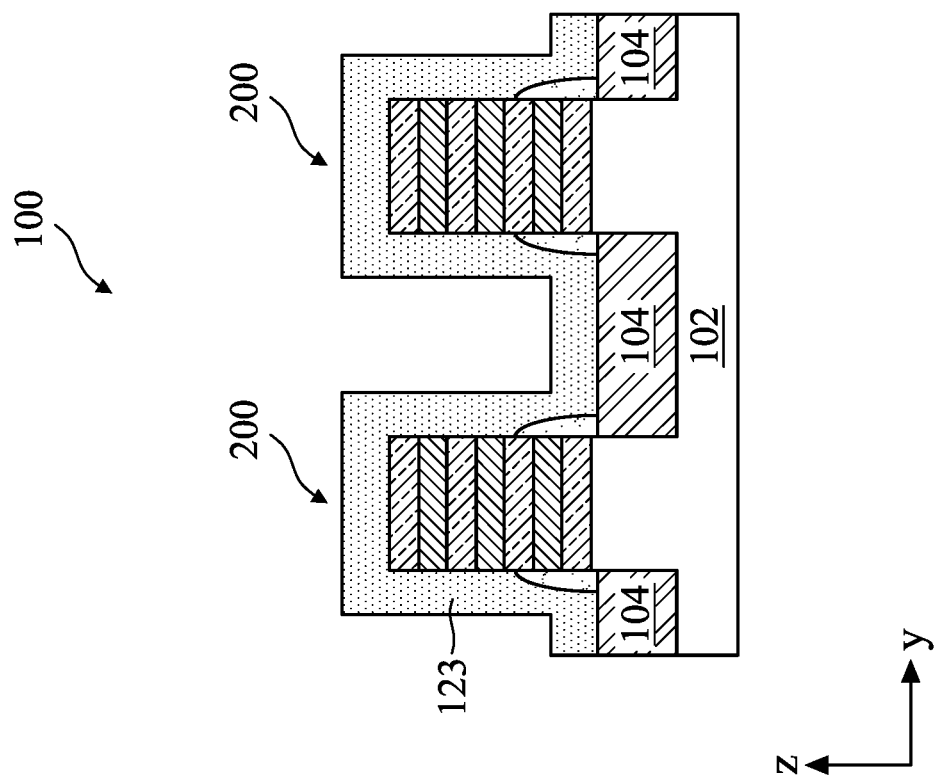

In embodiments where part of the spacer material 124' remains on sidewalls of the fins 200 (such as shown in FIG. 4), the spacer material 124' becomes sandwiched between the sidewall spacers 123 and the fins 200, such as shown in FIGS. 7A and 7B. FIG. 7A illustrates the device 100 when the blanket layer 123' is formed, similar to FIG. 6A. FIG. 7B illustrates the device 100 when the blanket layer 123' is etched to form the sidewall spacers 123, similar to FIG. 6B.

In some embodiments, the sidewall spacers 123 include a dielectric nitride material, such as silicon nitride, silicon carbonitride, silicon oxynitride, silicon oxycarbonitride, or a combination thereof, and may comprise one or multiple layers of material. The dielectric nitride material helps to apply tensile stress to source/drain structures 108 (see FIG. 11A) to be formed later. In some embodiments, the sidewall spacers 123 have a thickness (along the "y" direction in FIG. 6B) in a range from about 2 nm to about 10 nm, for example, as measured along the top surface of the isolation structure 104. Further, the sidewall spacer 123 has a gradually decreasing thickness along the "z" direction as its height increases.

In some embodiments, the gate spacers 124 and the sidewall spacers 123 include the same material(s) and are formed by the same process. In other words, the operations 14 and 16 are performed as one operation. For example, the gate spacers 124 and the sidewall spacers 123 may be formed by depositing a spacer material as a blanket layer having a substantially uniform thickness over the isolation structure 104, the fins 200, and the sacrificial gate stacks 106. Then the blanket layer is etched by an anisotropic etching process to expose the isolation structure 104, the sacrificial gate stacks 106, and the top surfaces of the fins 200. When the gate spacers 124 and the sidewall spacers 123 are formed by different processes, they may include the same material or different materials.

Figure 8B:
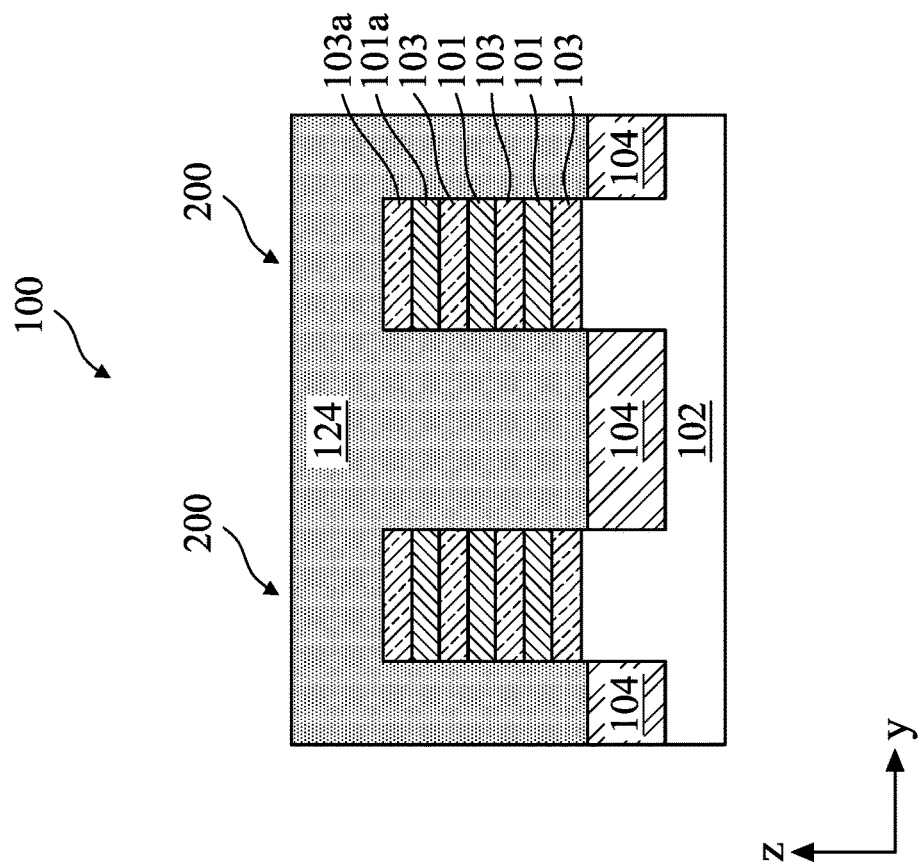
Figure 8A:
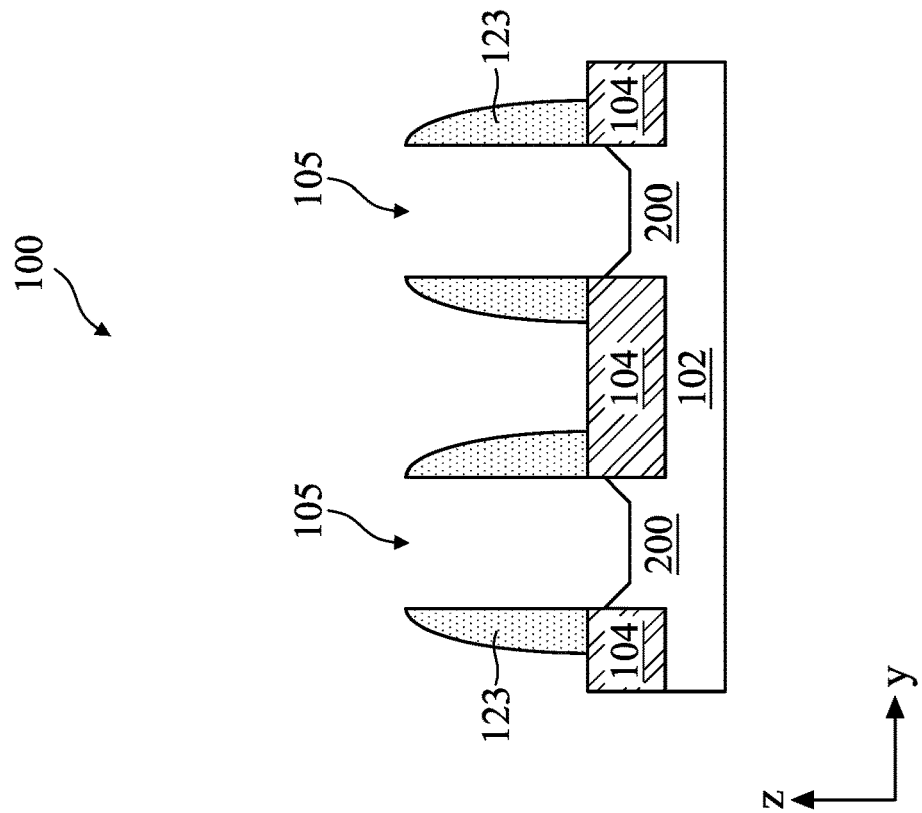

At operation 18, the method 10 (FIG. 1A) etches the fins 200 to form source/drain trenches 105 (FIG. 8A). The portions of the fins 200 under the gate spacers 124 (FIG. 8B) and the sacrificial gate stacks 106 are protected from this etching process. Operation 18 may include one or more photolithography process and etching processes. For example, the photolithography process may form a masking element covering areas of the device 100 that are not to be etched. The masking element provides openings through which the fins 200 are etched. In an embodiment, the etching process may include dry etching, wet etching, reactive ion etching (RIE), and/or other suitable processes. Further, the etching process is tuned selective to the materials of the fins 200, and with no (or minimal) etching to the gate spacers 124, the sacrificial gate stacks 106, the isolation structure 104, and the sidewall spacers 123. As a result of the etching process, various surfaces of the semiconductor layers 101 and 103 are exposed in each source/drain trench 105. The sidewall spacers 123 become sidewalls (or part thereof) of the source/drain trenches 105. Particularly, two opposing vertical (or substantially vertical) surfaces of the sidewall spacers 123 become sidewall surfaces (or part thereof) of the source/drain trenches 105, as illustrated in FIG. 8A. Operation 18 may etch the fins 200 such that the bottommost surface of the source/drain trenches 105 is below the top surface of the isolation structure 104.

Figure 9C:
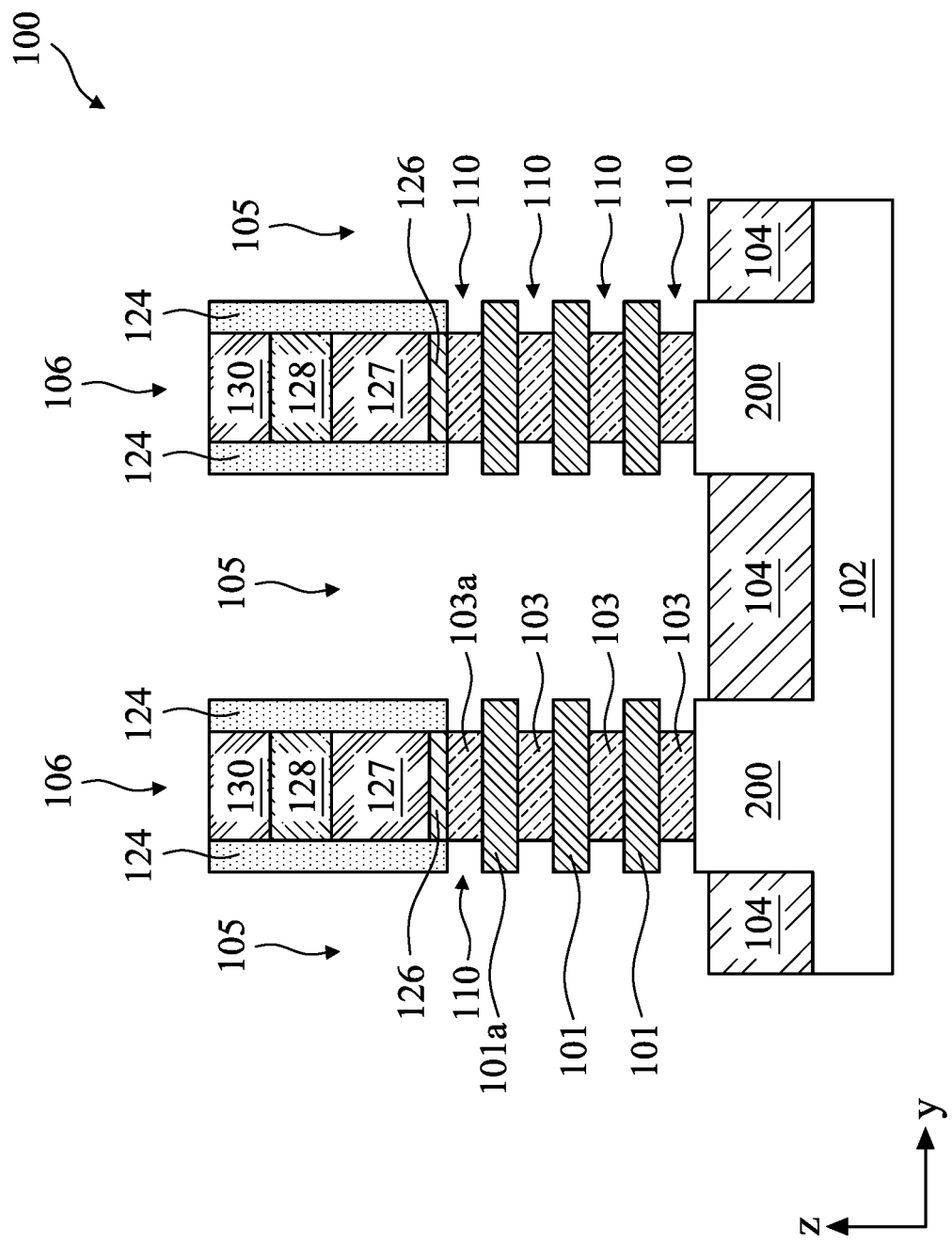

At operation 20, the method 10 (FIG. 1A) recesses the semiconductor layers 103 within the source/drain trenches 105, thereby creating gaps 110 vertically between every two adjacent semiconductor layers 101, between the bottommost semiconductor layer 101 and the portion of the fin 200 embedded in the isolation structure 104, and between the topmost semiconductor layer 101*a* and the gate spacer 124, such as shown in FIGS. 9B and 9C. The source/drain trenches 105 remain substantially unchanged (FIG. 9A).

As shown in FIG. 9C, each sacrificial gate stack 106 includes various layers such as a sacrificial gate dielectric layer 126, a sacrificial gate electrode layer 127, and hard mask layers 128 and 130. The sacrificial gate dielectric layer 126 may include a dielectric material such as silicon oxide (e.g., $SiO_2$) or silicon oxynitride (e.g., SiON), and may be formed by chemical oxidation, thermal oxidation, atomic layer deposition (ALD), CVD, and/or other suitable methods. The sacrificial gate electrode layer 127 may include poly-crystalline silicon (poly-Si) or other material(s) and may be formed by suitable deposition processes such as low-pressure chemical vapor deposition (LPCVD) and plasma-enhanced CVD (PECVD). The hard mask layer 128 may include silicon nitride or other suitable dielectric material and may be formed by CVD or other suitable methods. The hard mask layer 130 may include silicon oxide or other suitable dielectric material and may be formed by CVD or other suitable methods. The various layers 126, 127, 128, and 130 may be patterned by photolithography and etching processes.

In an embodiment, the operation 20 applies an etching process that is tuned selective to the material of the semiconductor layers 103, and with no (or minimal) etching to the gate spacers 124, the sidewall spacers 123, the sacrificial gate stacks 106, the isolation structure 104, and the semiconductor layers 101. Various etching parameters can be tuned to achieve selective etching of the semiconductor layers 103, such as etchant composition, etching temperature, etching solution concentration, etching time, etching pressure, source power, RF bias voltage, RF bias power, etchant flow rate, other suitable etching parameters, or combinations thereof. In some embodiment, the operation 20 further applies a cleaning process to the surfaces exposed in the source/drain trenches 105 after the etching process finishes. The cleaning process may include applying a diluted hydrofluoric acid (d-HF) to the various surfaces.

Figures 10A, 10B:
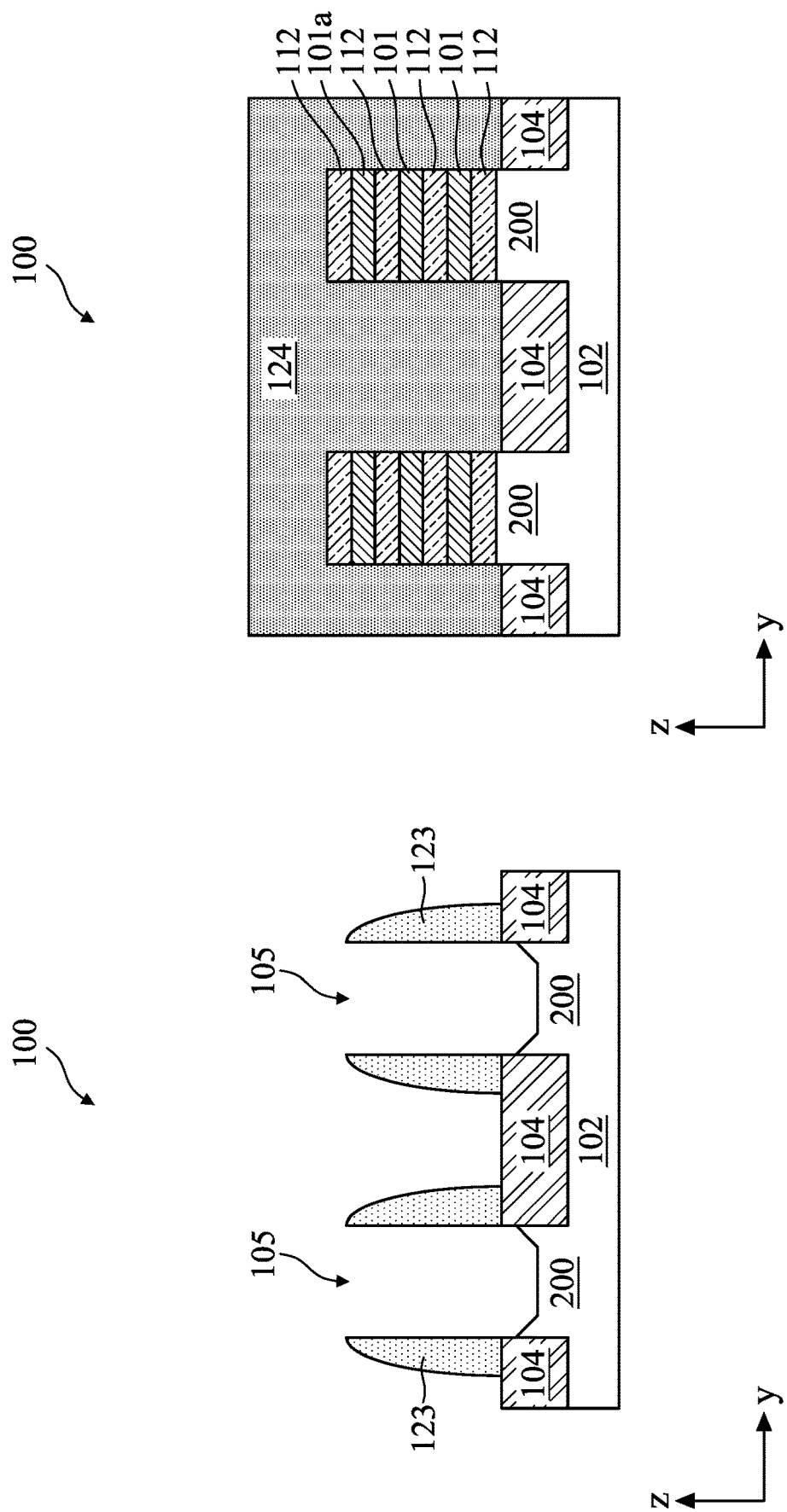
Figures 1, 10C:
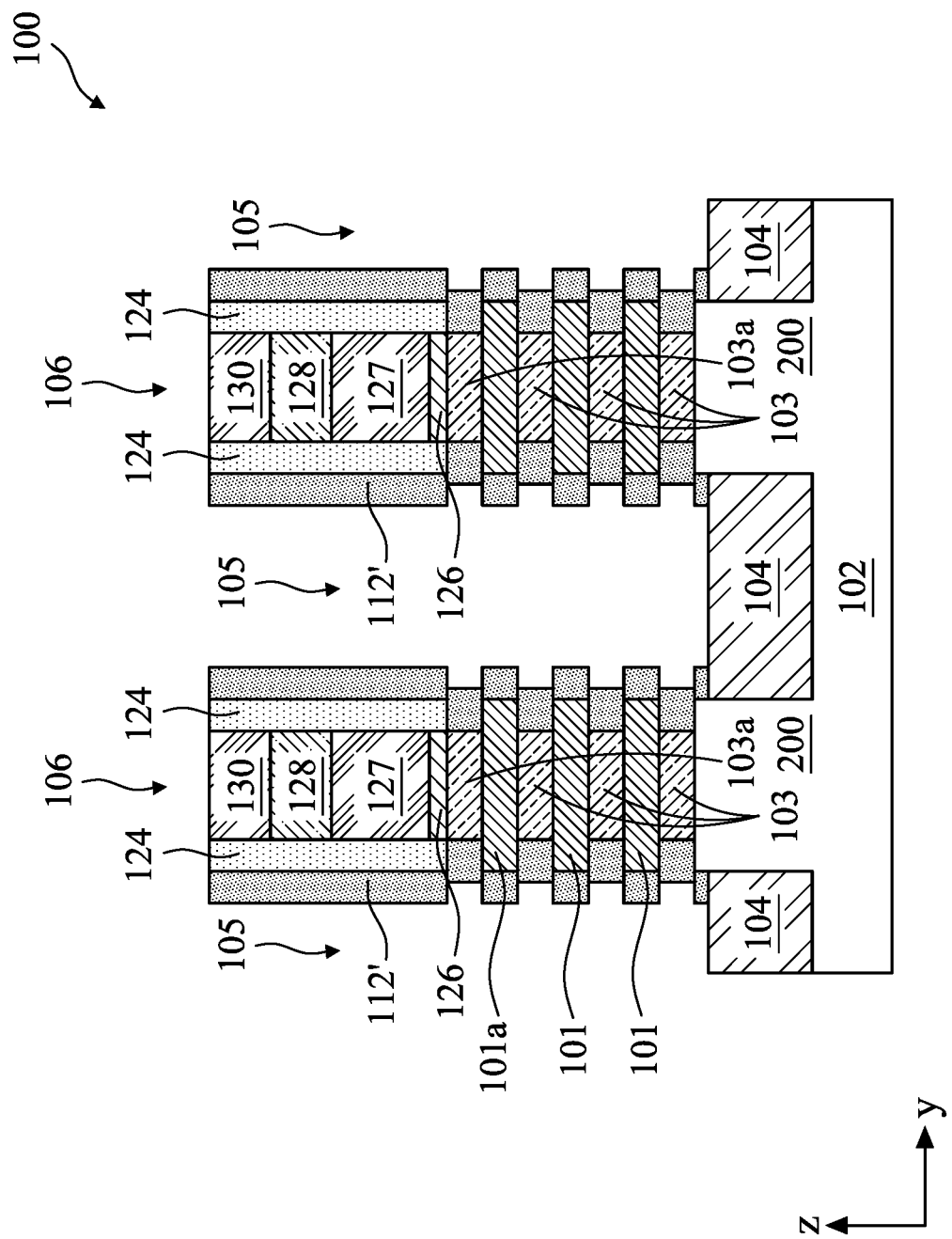
Figures 2, 10C:
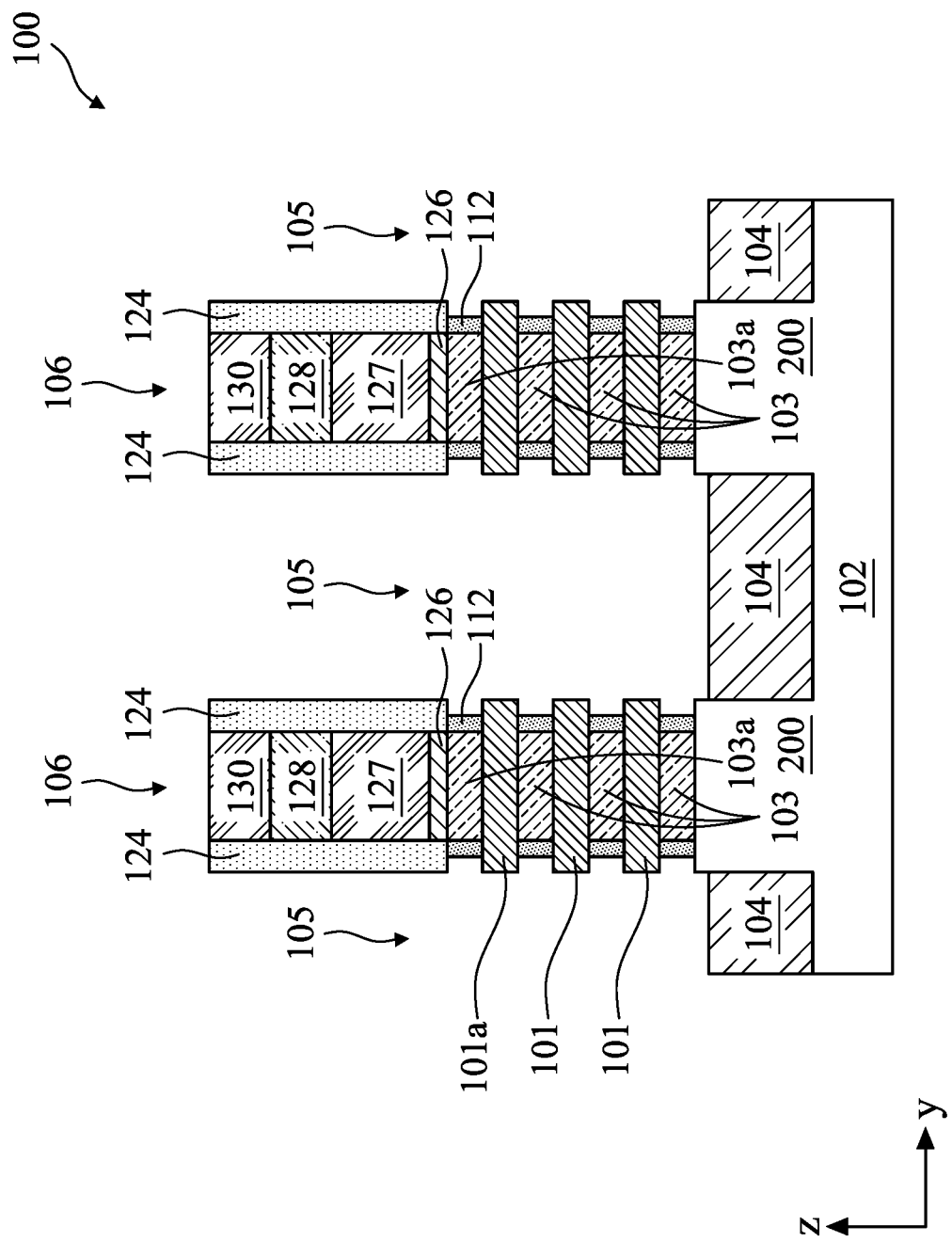

At operation 22, the method 10 (FIG. 1A) forms inner spacers 112 in the gaps 110, such as shown in FIGS. 10B and 10C-2. In an embodiment, the inner spacers 112 is formed by deposition and etch-back processes. For example, operation 22 may deposit a dielectric layer 112' along various exposed surfaces of the device 100, such as the top surface of the sacrificial gate stacks 106, the top and sidewalls of the gate spacers 124, the surfaces of the sidewall spacers 123, and the surfaces of the semiconductor layers 101 and 103 exposed in the source/drain trenches 105. This is illustrated in FIG. 10C-1. In the embodiment depicted in FIG. 10C-1, the dielectric layer 112' forms U-shapes (or a continuous wavy shape) along the vertical surfaces. Then, operation 22 may perform an etch-back process to the dielectric layer 112'. The etch-back process partially removes the dielectric layer 112' and leaves only the portions of the dielectric layer 112' inside the gaps 110 as the inner spacers 112, such as shown in FIG. 10C-2. Particularly, the dielectric layer is removed from the source/drain trenches 105, such as shown in FIGS. 10A and 10C-2. In various embodiments, the etch-back process may apply dry etching, wet etching, or reactive ion etching that is tuned selective to the material of the dielectric layer 112', and with minimal (to no) etching of the semiconductor layers 101, the sacrificial gate stacks 106, the gate spacers 124, and the sidewall spacers 123. For example, the etch-back process may apply an isotropic wet etching process.

In various embodiments, the inner spacers 112 may include a material that is different than materials in the semiconductor layers 101, the sidewall spacers 123, and the gate spacers 124 to achieve desired etching selectivity during the etch-back processes. In some embodiments, the inner spacers 112 include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacers 112 include a low-k dielectric material. Example low-k dielectric materials include fluoride-doped silica glass, carbon doped silicon oxide, polyimide, other low-k dielectric material, or combinations thereof. The topmost one of the inner spacers 112 has a thickness that is substantially equal to the thickness of the semiconductor layer 103*a*, which is in a range from about 2 nm to about 20 nm in various embodiments. As shown in the embodiment illustrated in FIG. 10C-2, the inner spacers 112 are on sidewalls of the recessed semiconductor layers 103 (and 103a) and fill a portion of the space vertically between adjacent semiconductor layers 101. This effectively re-claims a portion of each gap 110.

Figure 11B:
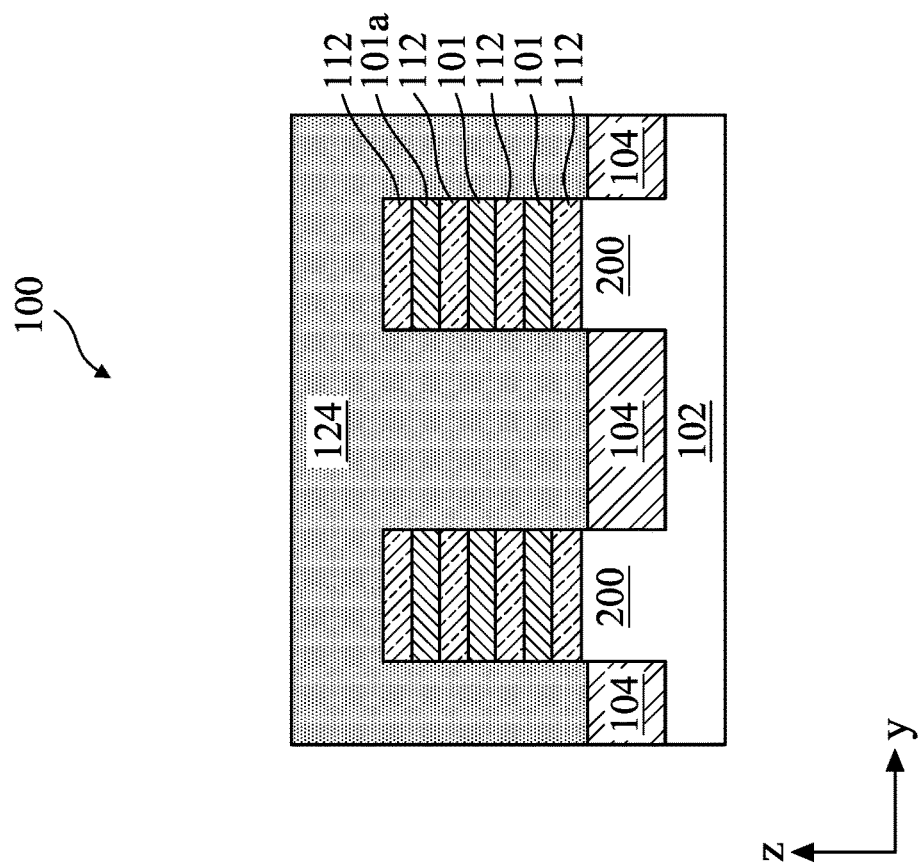
Figure 11A:
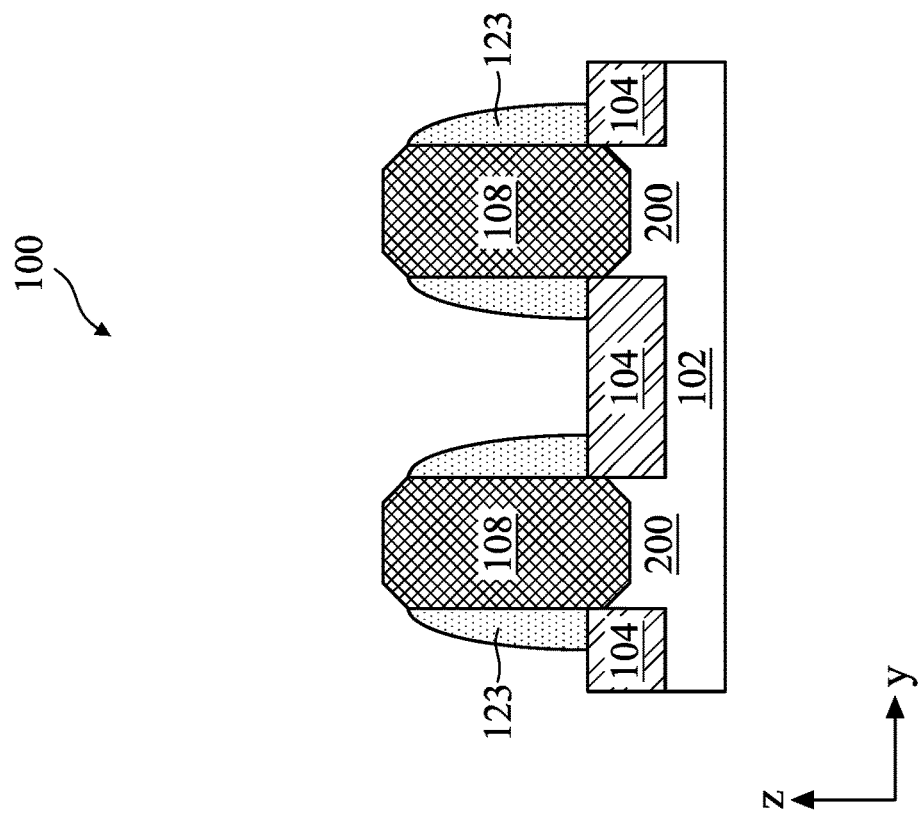
Figure 11C:
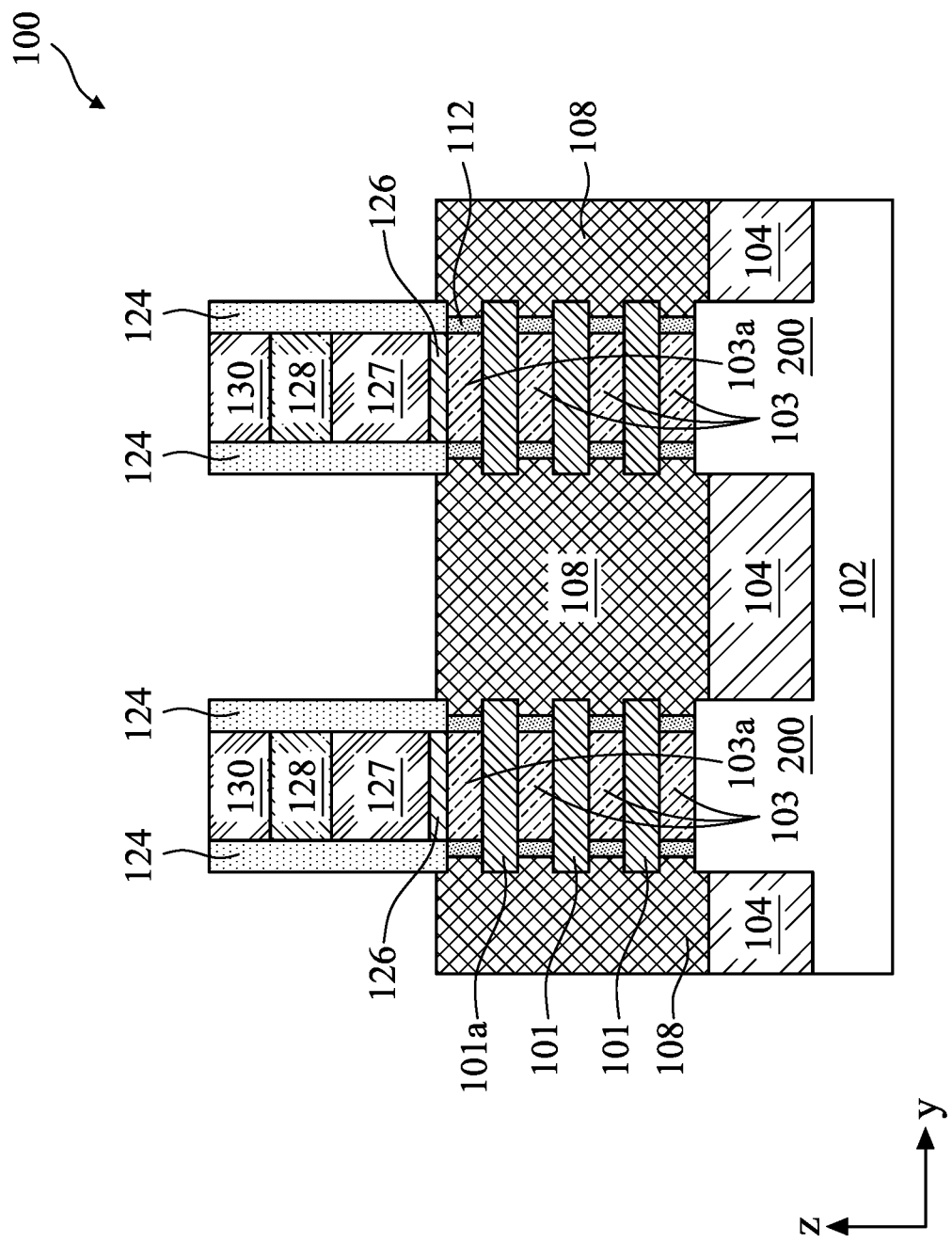

At operation 24, the method 10 (FIG. 1B) epitaxially grows source/drain structures 108 from the surfaces of the semiconductor layers 101 and the fins 200 that are exposed in the source/drain trenches 105, as illustrated in FIGS. 11A and 11C. The inner spacers 112 remain under the gate spacers 124, such as shown in FIGS. 11B and 11C. An epitaxy process can use chemical vapor deposition (CVD) techniques (for example, vapor phase epitaxy and/or Ultra-High Vacuum CVD), molecular beam epitaxy, other suitable epitaxial growth processes, or combinations thereof. The epitaxy process can use gaseous and/or liquid precursors, which interact with the composition of the semiconductor layers 101. The method 10 may also dope the epitaxial source/drain structures 108 with n-type dopants and/or p-type dopants. In some embodiments, for n-type transistors, the epitaxial source/drain structures 108 include silicon and can be doped with carbon, phosphorous, arsenic, other n-type dopant, or combinations thereof (for example, forming Si:C epitaxial source/drain structures, Si:P epitaxial source/drain structures, or Si:C:P epitaxial source/drain structures). In some embodiments, for p-type transistors, the epitaxial source/drain structures 108 include silicon germanium or germanium, and can be doped with boron, other p-type dopant, or combinations thereof (for example, forming Si:Ge:B epitaxial source/drain structures). In some embodiments, the epitaxial source/drain structures 108 may include multiple epitaxial semiconductor layers where the multiple epitaxial semiconductor layers have different levels of dopant density. Further, the doping can be in-situ (i.e., doped during deposition by adding impurities to a source material of the epitaxy process) or ex-situ (e.g., doped by an ion implantation process subsequent to a deposition process). In some embodiments, annealing processes (e.g., rapid thermal annealing (RTA) and/or laser annealing) are performed to activate dopants in the epitaxial source/drain structures 108.

As shown in FIG. 11A, the sidewall spacers 123 confine the lateral growth of the source/drain structures 108 such that the two opposing vertical surfaces of the sidewall spacers 123 sandwich each source/drain structure 108. By using the sidewall spacers 123, each source/drain structure 108 does not merge or contact another source/drain structure 108, preventing defects caused by inadvertent merging of source/drain structures. The present disclosure achieves this benefit without using a hybrid (or dielectric) fin between adjacent source/drain structures 108. Without using a hybrid (or dielectric) fin also allows more room in the gate trenches (see gate trenches 125 in FIG. 15) for gate patterning processes, such as multiple work function metal patterning. Further, the volume of each source/drain structure 108 is limited to the space between the two opposing vertical surfaces of the sidewall spacers 123, which is the same as the space occupied by a fin 200 prior to the operation 18. This advantageously increases the density of the respective transistors. The limited volume of the source/drain structures 108 reduces the parasitic capacitance in the source/drain structures 108, which advantageously increases the switching speed of the transistors. Further, the sidewall spacers 123 may apply a transverse tensile stress to the source/drain structures 108 (for both NMOS and PMOS), for example, by using a dielectric nitride material, which increases the carrier mobility of the respective transistors.

Figure 13:
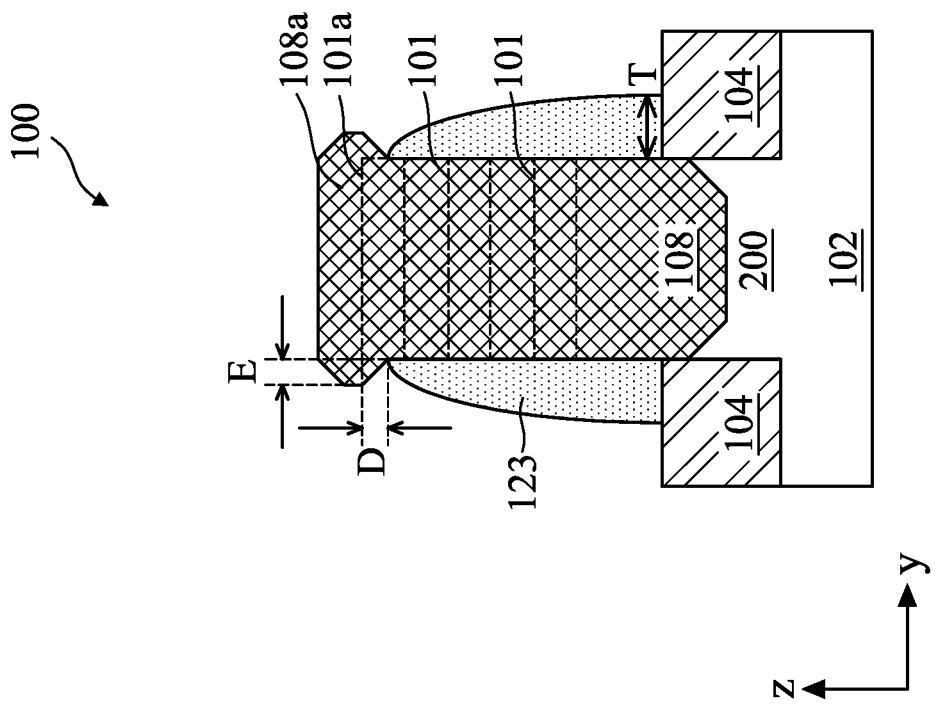
Figure 12:
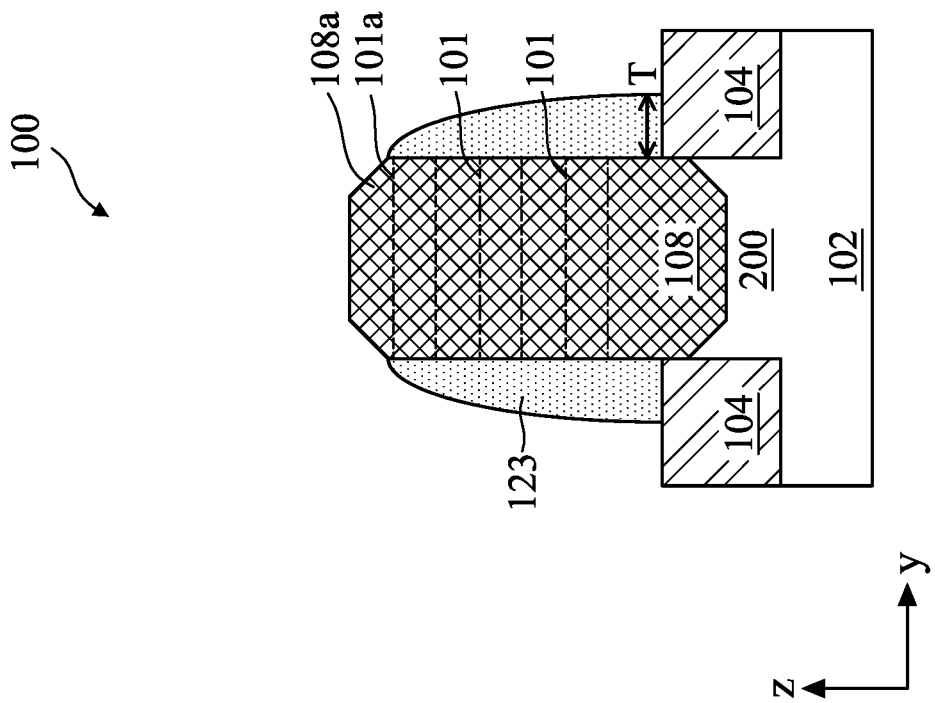

Furthermore, the height of the sidewall spacers 123 may directly impact the lateral growth and the volume of the source/drain structure 108. Two examples are illustrated in FIGS. 12 and 13. In FIGS. 12 and 13, the semiconductor layers 101 and 101a (which are under the gate spacer 124 and the sacrificial gate stack 106) are illustrated with dashed lines. In the embodiment depicted in FIG. 12, the sidewall spacers 123 extend above the top surface of the topmost semiconductor layer 101a. To further this embodiment, operation 24 may control the epitaxial growth process such that a top portion 108a of the source/drain structure 108 does not extend laterally beyond the opposing vertical surfaces of the sidewall spacers 123. In other words, the top portion 108a has a width equal to or less than a distance between the two opposing vertical surfaces of the sidewall spacers 123 along the "y" direction (which is the widthwise direction of the fin 200). The top portion 108a refers to the portion of the source/drain structure 108 that is above the top surface of the sidewall spacers 123.

In the embodiment depicted in FIG. 13, the sidewall spacers 123 extend above the bottom surface of the topmost semiconductor layer 101a but is below the top surface of the topmost semiconductor layer 101a. To further this embodiment, operation 24 may control the epitaxial growth process such that the top portion 108a of the source/drain structure 108 may extend laterally beyond the opposing vertical surfaces of the sidewall spacers 123 but the extension dimension E is less than or equal to 10 nm (i.e., in a range of 0 nm to 10 nm). The extension dimension E is measured along the "y" direction starting from the opposing vertical surfaces of the sidewall spacers 123. In the embodiment depicted in FIG. 13, the top surface of the sidewall spacers 123 is below the top surface of the topmost semiconductor layer 101a by a distance D. In an embodiment, the distance D is less than or equal to 8 nm. Further, the thickness T of the sidewall spacers 123 (as measured near the top surface of the isolation structure 104) is in a range from about 2 nm to about 10 nm in the embodiments depicted in FIGS. 12 and 13.

Figure 14:
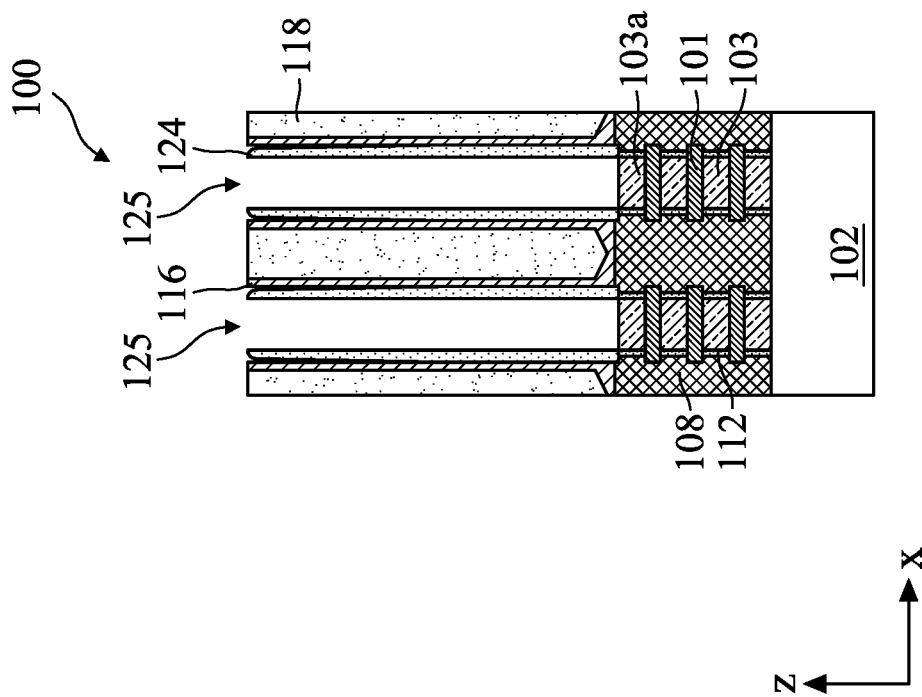

At operation 26, the method 10 (FIG. 1B) forms a contact etch stop layer (CESL) 116 and an inter-level dielectric (ILD) layer 118 over the device 100. As illustrated in FIG. 14, the CESL 116 is formed over the source/drain structures 108, the sacrificial gate stacks 106, and the sidewalls of the gate spacers 124. Although not shown, the CESL 116 is also formed over the sidewall spacers 123. The ILD layer 118 is deposited over the CESL 116. The CESL 116 may comprise silicon nitride, silicon oxynitride, silicon nitride with oxygen (O) or carbon (C) elements, and/or other materials; and may be formed by CVD, PVD, ALD, or other suitable methods. In an embodiment, the CESL 116 is deposited to a substantially uniform thickness along the various surfaces discussed above. The ILD layer 118 may comprise an oxided formed with tetraethylorthosilicate, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The ILD layer 118 may be formed by PECVD (plasma enhanced CVD), FCVD (flowable CVD), or other suitable methods. The ILD layer 118 fills the various trenches between the sacrificial gate stacks 106 and between the source/drain structures 108.

Figure 15:
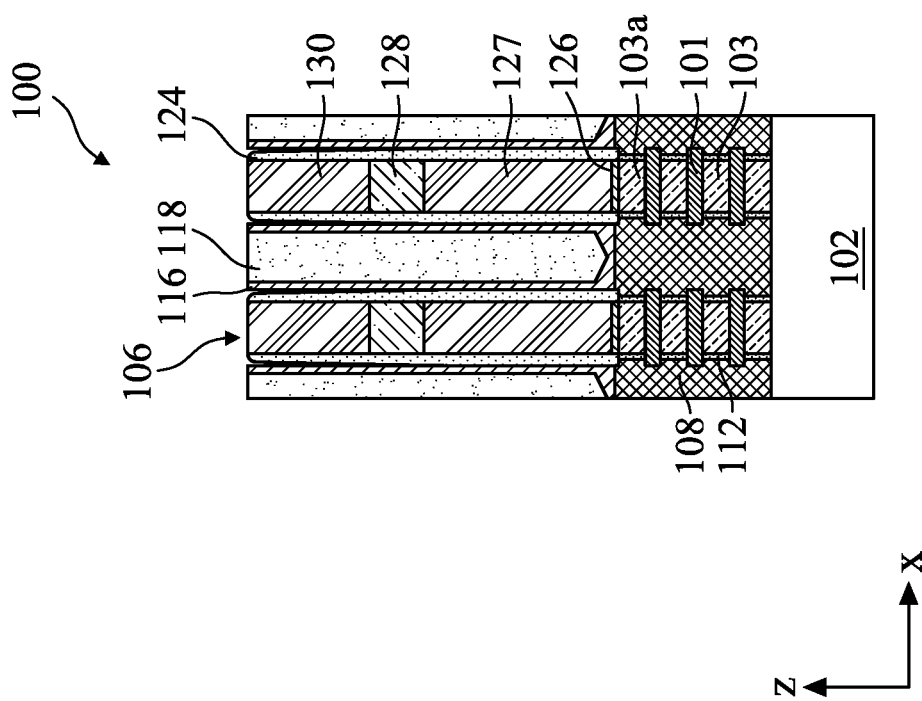

At operation 28, the method 10 (FIG. 1B) removes the sacrificial gate stacks 106 from the device 100, thereby forming gate trenches 125 (FIG. 15). In an embodiment, the operation 28 may perform a CMP process to the device 100 to expose a top surface of the sacrificial gate stacks 106. Then, the operation 28 performs one or more etching process to remove the sacrificial gate stacks 106, including the hard mask layers 128 and 130, the sacrificial gate electrode layer 127, and the sacrificial gate dielectric layer 126. The etching process may include dry etching, wet etching, reactive ion etching, combinations thereof, or other suitable etching processes. The etching process is tuned selective to the materials of the sacrificial gate stacks 106, with no (or minimal) etching to the ILD layer 118, the CESL 116, the gate spacers 124, and the fins 200 (including the semiconductor layers 101 and 103). As depicted in FIG. 15, the etching process results in gate trenches 125 between two opposing gate spacers 124. The gate trenches 125 expose channel regions of the fins 200 which include the semiconductor layers 103 and 101.

Figure 16:
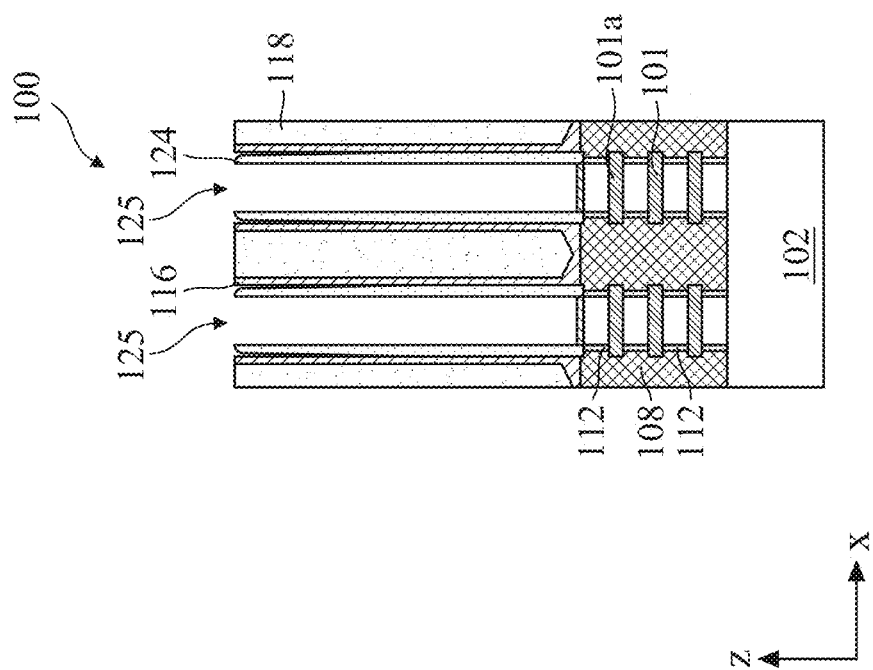

At operation 30, the method 10 (FIG. 1B) selectively removes the semiconductor layers 103 from the gate trenches 125 (FIG. 16). This process is also referred to as a channel release process in some embodiments. In the embodiment depicted in FIG. 16, an etching process selectively etches the semiconductor layers 103 with minimal (to no) etching of the semiconductor layers 101 and, in some embodiments, minimal (to no) etching of the gate spacers 124 and the inner spacers 112. Various etching parameters can be tuned to achieve selective etching of the semiconductor layers 103, such as etchant composition, etching temperature, etching solution concentration, etching time, etching pressure, source power, RF bias voltage, RF bias power, etchant flow rate, other suitable etching parameters, or combinations thereof. The etching process can be a dry etching process, a wet etching process, other suitable etching process, or combinations thereof. In some embodiments, a dry etching process (such as a surface gas/radical reaction process) utilizes a fluorine-containing gas (for example, HF, $F_2$, $NF_3$, $CF_4$, $SF_6$, $CH_2F_2$, $CHF_3$, and/or $C_2F_6$) to selectively etch the semiconductor layers 103 which include silicon germanium. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch the semiconductor layers 103. In some embodiments, a chemical vapor phase etching process using hydrochloric acid (HCl) selectively etches the semiconductor layers 103. Because of the etch selectivity, the inner spacers 112 protects the source/drain structures 108 from the etching process. As illustrated in FIG. 16, the topmost one of the inner spacers 112 sits above the topmost semiconductor layer 101a.

As a result of the operation 30, the semiconductor layers 101 are suspended over the substrate 102 and connecting the source/drain structures 108 on opposing sides of each gate trench 125, and the inner spacers 112 are exposed in the gate trench 125. In some embodiments, after removing the semiconductor layers 103, an etching process is performed to modify a profile of the semiconductor layers 101 to achieve desired dimensions and/or desired shapes (e.g., cylindrical-shaped (e.g., nanowire), rectangular-shaped (e.g., nanobar), sheet-shaped (e.g., nanosheet), etc.). The present disclosure further contemplates embodiments where the semiconductor layers 101 have sub-nanometer dimensions depending on design requirements of the device 100.

Figure 17:
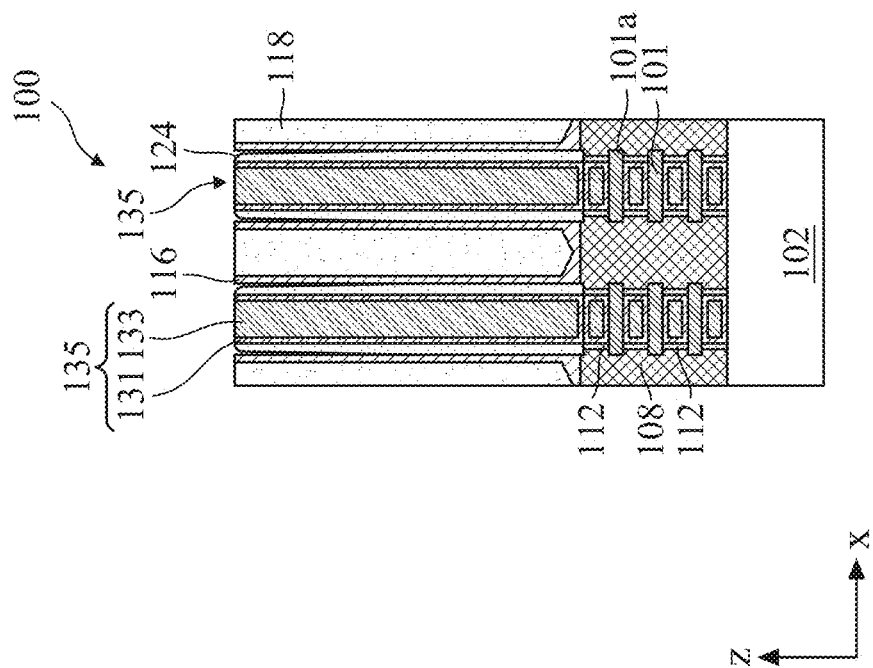

At operation 32, the method 10 (FIG. 1B) forms high-k metal gate stacks (HKMG) 135 in the gate trenches 125, surrounding each of the semiconductor layers 101 (FIG. 17). In an embodiment, the HKMG 135 includes a gate dielectric layer 131 and one or more metal layers 133. The gate dielectric layer 131 may include a high-k dielectric material such as hafnium oxide, zirconium oxide, lanthanum oxide, titanium oxide, yttrium oxide, and strontium titanate. The gate dielectric layer 131 may be formed by chemical oxidation, thermal oxidation, atomic layer deposition (ALD), chemical vapor deposition (CVD), and/or other suitable methods. In some embodiments, the HKMG 135 further includes an interfacial layer between the gate dielectric layer 131 and the semiconductor layers 101. The interfacial layer may include silicon oxide, silicon oxynitride, or other suitable materials. The one or more metal layers 133 may include one or more work function metal layers over the gate dielectric layer 131 and a metal fill layer over the work function metal layer(s). In some embodiments, the work function metal layer(s) may include an n-type or a p-type work function layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. The work function metal layer(s) may be formed by CVD, PVD, ALD, and/or other suitable processes. In embodiments, the metal fill layer may include aluminum, tungsten, cobalt, copper, and/or other suitable materials, and may be formed by CVD, PVD, plating, and/or other suitable processes.

At operation 34, the method 10 (FIG. 1B) performs further fabrication steps to the device 100. For example, the method 10 may etch the ILD layer 118 and the CESL 116 in the source/drain regions of the device 100 to form contact holes exposing the source/drain structures 108, form silicide layer(s) on the source/drain structures 108, form source/drain contacts over the silicide layer(s), form gate contacts connecting to the HKMG 135, and form interconnect layers.

Although not intended to be limiting, embodiments of the present disclosure provide one or more of the following advantages. For example, by using sidewall spacers to confine the lateral growth of source/drain structures, the source/drain structures do not incur merging defects. Further, the volume of each source/drain structure is limited by the sidewall spacers, which advantageously increases the density of transistors, reduces the parasitic capacitance in the source/drain structures, and increases the switching speed of the transistors. Furthermore, the sidewall spacers may apply a transverse tensile stress to the source/drain structures to increase the carrier mobility of the respective transistors. Still further, some embodiments of the present disclosure achieve the above benefits without using a dielectric fin between adjacent source/drain structures, which allows more room in the gate trenches for gate patterning processes. Embodiments of the present disclosure can be readily integrated with existing semiconductor manufacturing processes.

In one example aspect, the present disclosure is directed to a method that includes providing a structure having a substrate, an isolation structure over the substrate, and a fin extending from the substrate and through the isolation structure. The fin includes a stack of layers extending above the isolation structure. The stack of layers include first layers of a first semiconductor material and second layers of a second semiconductor material different from the first semiconductor material. The first and the second layers are alternately stacked. A topmost layer of the stack of layers is one of the second layers. The structure further has a sacrificial gate stack engaging a channel region of the fin. The method further includes forming gate spacers on sidewalls of the sacrificial gate stack and forming sidewall spacers on sidewalls of the fin in a source/drain region of the fin, wherein the sidewall spacers extend above a bottom surface of a topmost one of the first layers, and the sidewall spacers are adjacent to the gate spacers. The method further includes etching the fin in the source/drain region of the fin, resulting in a source/drain trench; partially recessing the second layers exposed in the source/drain trench, resulting in gaps vertically between two adjacent layers of the first layers and vertically between the gate spacers and the topmost one of the first layers; and forming dielectric inner spacers inside the gaps.

In an embodiment, the method further includes epitaxially growing a third layer of a third semiconductor material from portions of the first layers exposed in the source/drain trench, wherein the sidewall spacers confine lateral growth of the third layer. In a further embodiment, a first portion of the third layer is above a top surface of the sidewall spacers, the first portion has a width equal to or less than a distance between two opposing surfaces of the sidewall spacers along a widthwise direction of the fin, and the sidewall spacers extend above a top surface of the topmost one of the first layers. In another further embodiment, a first portion of the third layer is above a top surface of the sidewall spacers, the first portion extends beyond two opposing surfaces of the sidewall spacers along a widthwise direction of the fin by a dimension equal to or less than 10 nm, and the sidewall spacers are below a top surface of the topmost one of the first layers. In yet another further embodiment, the method further includes removing the sacrificial gate stack, resulting in a gate trench; and removing the second layers from the gate trench, thereby exposing the dielectric inner spacers in the gate trench. In a further embodiment, the method further includes forming a high-k metal gate stack in the gate trench, wherein the high-k metal gate stack wraps around each of the first layers.

In an embodiment of the method, the first semiconductor material includes silicon and the second semiconductor material includes silicon germanium. In another embodiment, the sidewall spacers include a dielectric nitride and has a thickness in a range of about 2 nm to about 10 nm. In another embodiment, the forming of the sidewall spacers includes depositing a dielectric nitride material with a substantially uniform thickness over a top surface and the sidewalls of the fin and over the isolation structure; performing an anisotropic etching to the dielectric nitride material with the isolation structure serving as an etch stop; and performing an over-etching to the dielectric nitride material.

In an embodiment of the method, the gate spacers and the sidewall spacers are formed by a same process. In another embodiment, the topmost layer of the stack of layers has a thickness in a range of about 2 nm to about 20 nm.

In another example aspect, the present disclosure is directed to a method that includes providing a structure having a substrate, an isolation structure over the substrate, and fins extending from the substrate and through the isolation structure. Each of the fins includes a stack of layers extending above the isolation structure. The stack of layers include first layers of a first semiconductor material and second layers of a second semiconductor material different from the first semiconductor material. The first and the second layers are alternately stacked. A topmost layer of the stack of layers is one of the second layers. The structure further has a sacrificial gate stack engaging channel regions of the fins. The method further includes forming gate spacers on sidewalls of the sacrificial gate stack and forming sidewall spacers on sidewalls of the fins in source/drain regions of the fins, wherein the sidewall spacers extend above a bottom surface of a topmost one of the first layers. The method further includes etching the fins in the source/drain regions of the fins, resulting in source/drain trenches, wherein the source/drain trenches expose opposing sidewalls of adjacent sidewall spacers. The method further includes partially recessing the second layers exposed in the source/drain trench, resulting in gaps vertically between two adjacent layers of the first layers and vertically between the gate spacers and the topmost one of the first layers. The method further includes forming dielectric inner spacers inside the gaps; epitaxially growing a third layer of a third semiconductor material in the source/drain trenches, wherein the sidewall spacers confine lateral growth of the third layer; and replacing the sacrificial gate stack with a high-k metal gate stack, wherein the high-k metal gate stack wraps around each of the first layers.

In an embodiment of the method, the replacing of the sacrificial gate stack includes removing the sacrificial gate stack, resulting in a gate trench; removing the second layers from the gate trench; and forming the high-k metal gate stack in the gate trench.

In an embodiment of the method, the gate spacers and the sidewall spacers are formed by separate processes. In another embodiment, the first semiconductor material includes silicon, the second semiconductor material includes silicon germanium, and the topmost layer of the stack of layers has a thickness in a range of about 2 nm to about 20 nm. In another embodiment, the structure does not include a dielectric fin between adjacent ones of the fins.

In yet another example aspect, the present disclosure is directed to a semiconductor structure that includes a substrate; an isolation structure over the substrate; two source/drain structures extending from the substrate; semiconductor channel layers suspended over the substrate and connecting the two source/drain structures; a high-k metal gate stack between the two source/drain structures and wrapping around each of the semiconductor channel layers; gate spacers on two opposing sidewalls of the high-k metal gate stack; dielectric inner spacers disposed vertically between two adjacent layers of the semiconductor channel layers and vertically between the gate spacers and a topmost one of the semiconductor channel layers; and sidewall spacers over the isolation structure and contacting sidewalls of the two source/drain structures, wherein the sidewall spacers extend above a bottom surface of the topmost one of the semiconductor channel layers.

In an embodiment of the semiconductor structure, a first portion of one of the source/drain structures is above a top surface of two of the sidewall spacers that sandwich the one of the source/drain structures, the first portion has a width equal to or less than a distance between two opposing vertical surfaces of the two of the sidewall spacers, and the top surface of the two of the sidewall spacers is above a top surface of the topmost one of the semiconductor channel layers.

In another embodiment of the semiconductor structure, a first portion of one of the source/drain structures is above a top surface of two of the sidewall spacers that sandwich the one of the source/drain structures, the first portion extends laterally beyond two opposing vertical surfaces of the two of the sidewall spacers by a dimension equal to or less than 10 nm, and the top surface of the two of the sidewall spacers is below a top surface of the topmost one of the semiconductor channel layers.

In yet another embodiment of the semiconductor structure, each of the sidewall spacers has a thickness in a range from about 2 nm to about 10 nm, and a topmost one of the dielectric inner spacers has a thickness in a range from about 2 nm to about 20 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a structure having a substrate, an isolation structure over the substrate, and a fin extending from the substrate and through the isolation structure, wherein the fin includes a stack of layers extending above the isolation structure, the stack of layers include first layers of a first semiconductor material and second layers of a second semiconductor material different from the first semiconductor material, the first and the second layers are alternately stacked, a topmost layer of the stack of layers is one of the second layers, the structure further having a sacrificial gate stack engaging a channel region of the fin;
   forming gate spacers on sidewalls of the sacrificial gate stack;
   forming sidewall spacers on sidewalls of the fin in a source/drain region of the fin, wherein the sidewall spacers extend above a bottom surface of a topmost one of the first layers, and the sidewall spacers are adjacent to the gate spacers;
   etching the fin in the source/drain region of the fin, resulting in a source/drain trench;
   partially recessing the second layers exposed in the source/drain trench, resulting in gaps vertically between two adjacent layers of the first layers and vertically between the gate spacers and the topmost one of the first layers; and
   forming dielectric inner spacers inside the gaps.

2. The method of claim 1, further comprising:
   epitaxially growing a third layer of a third semiconductor material from portions of the first layers exposed in the source/drain trench, wherein the sidewall spacers confine lateral growth of the third layer.

3. The method of claim 2, wherein a first portion of the third layer is above a top surface of the sidewall spacers, the first portion has a width equal to or less than a distance between two opposing surfaces of the sidewall spacers along a widthwise direction of the fin, and the sidewall spacers extend above a top surface of the topmost one of the first layers.

4. The method of claim 2, wherein a first portion of the third layer is above a top surface of the sidewall spacers, the first portion extends beyond two opposing surfaces of the sidewall spacers along a widthwise direction of the fin by a dimension equal to or less than 10 nm, and the sidewall spacers are below a top surface of the topmost one of the first layers.

5. The method of claim 2, further comprising:
   removing the sacrificial gate stack, resulting in a gate trench; and
   removing the second layers from the gate trench, thereby exposing the dielectric inner spacers in the gate trench.

6. The method of claim 5, further comprising:
   forming a high-k metal gate stack in the gate trench, wherein the high-k metal gate stack wraps around each of the first layers.

7. The method of claim 1, wherein the first semiconductor material includes silicon and the second semiconductor material includes silicon germanium.

8. The method of claim 1, wherein the sidewall spacers include a dielectric nitride and has a thickness in a range of about 2 nm to about 10 nm.

9. The method of claim 1, wherein the forming of the sidewall spacers includes:
   depositing a dielectric nitride material with a substantially uniform thickness over a top surface and the sidewalls of the fin and over the isolation structure;
   performing an anisotropic etching to the dielectric nitride material with the isolation structure serving as an etch stop; and
   performing an over-etching to the dielectric nitride material.

10. The method of claim 1, wherein the gate spacers and the sidewall spacers are formed by a same process.

11. The method of claim 1, wherein the topmost layer of the stack of layers has a thickness in a range of about 2 nm to about 20 nm.

12. A method comprising:
    providing a structure having a substrate, an isolation structure over the substrate, and fins extending from the substrate and through the isolation structure, wherein each of the fins includes a stack of layers extending above the isolation structure, the stack of layers include first layers of a first semiconductor material and second layers of a second semiconductor material different from the first semiconductor material, the first and the second layers are alternately stacked, a topmost layer of the stack of layers is one of the second layers, the structure further having a sacrificial gate stack engaging channel regions of the fins;
    forming gate spacers on sidewalls of the sacrificial gate stack;
    forming sidewall spacers on sidewalls of the fins in source/drain regions of the fins, wherein the sidewall spacers extend above a bottom surface of a topmost one of the first layers;
    etching the fins in the source/drain regions of the fins, resulting in source/drain trenches, wherein the source/drain trenches expose opposing sidewalls of adjacent sidewall spacers;
    partially recessing the second layers exposed in the source/drain trench, resulting in gaps vertically between two adjacent layers of the first layers and vertically between the gate spacers and the topmost one of the first layers;
    forming dielectric inner spacers inside the gaps;
    epitaxially growing a third layer of a third semiconductor material in the source/drain trenches, wherein the sidewall spacers confine lateral growth of the third layer; and
    replacing the sacrificial gate stack with a high-k metal gate stack, wherein the high-k metal gate stack wraps around each of the first layers.

13. The method of claim 12, wherein the replacing of the sacrificial gate stack includes:
removing the sacrificial gate stack, resulting in a gate trench;
removing the second layers from the gate trench; and
forming the high-k metal gate stack in the gate trench.

14. The method of claim 12, wherein the gate spacers and the sidewall spacers are formed by separate processes.

15. The method of claim 12, wherein the first semiconductor material includes silicon, the second semiconductor material includes silicon germanium, and the topmost layer of the stack of layers has a thickness in a range of about 2 nm to about 20 nm.

16. The method of claim 12, wherein the structure does not include a dielectric fin between adjacent ones of the fins.

17. A semiconductor structure, comprising:
a substrate;
an isolation structure over the substrate;
two source/drain structures extending from the substrate;
semiconductor channel layers suspended over the substrate and connecting the two source/drain structures;
a high-k metal gate stack between the two source/drain structures and wrapping around each of the semiconductor channel layers;
gate spacers on two opposing sidewalls of the high-k metal gate stack;
dielectric inner spacers disposed vertically between two adjacent layers of the semiconductor channel layers and vertically between the gate spacers and a topmost one of the semiconductor channel layers; and
sidewall spacers over the isolation structure and contacting sidewalls of the two source/drain structures, wherein the sidewall spacers extend above a bottom surface of the topmost one of the semiconductor channel layers.

18. The semiconductor structure of claim 17, wherein a first portion of one of the source/drain structures is above a top surface of two of the sidewall spacers that sandwich the one of the source/drain structures, the first portion has a width equal to or less than a distance between two opposing vertical surfaces of the two of the sidewall spacers, and the top surface of the two of the sidewall spacers is above a top surface of the topmost one of the semiconductor channel layers.

19. The semiconductor structure of claim 17, wherein a first portion of one of the source/drain structures is above a top surface of two of the sidewall spacers that sandwich the one of the source/drain structures, the first portion extends laterally beyond two opposing vertical surfaces of the two of the sidewall spacers by a dimension equal to or less than 10 nm, and the top surface of the two of the sidewall spacers is below a top surface of the topmost one of the semiconductor channel layers.

20. The semiconductor structure of claim 17, wherein each of the sidewall spacers has a thickness in a range from about 2 nm to about 10 nm, and a topmost one of the dielectric inner spacers has a thickness in a range from about 2 nm to about 20 nm.

* * * * *